US011988687B2

(12) United States Patent
Tsumura

(10) Patent No.: US 11,988,687 B2
(45) Date of Patent: May 21, 2024

(54) INSPECTION JIG AND BOARD INSPECTION APPARATUS INCLUDING THE SAME

(71) Applicant: NIDEC READ CORPORATION, Kyoto (JP)

(72) Inventor: Kohei Tsumura, Kyoto (JP)

(73) Assignee: NIDEC READ CORPORATION, Muko (JP)

( * ) Notice: Subject to any disclaimer, the term of this patent is extended or adjusted under 35 U.S.C. 154(b) by 66 days.

(21) Appl. No.: 17/910,353

(22) PCT Filed: Feb. 22, 2021

(86) PCT No.: PCT/JP2021/006519
§ 371 (c)(1),
(2) Date: Sep. 9, 2022

(87) PCT Pub. No.: WO2021/182083
PCT Pub. Date: Sep. 16, 2021

(65) Prior Publication Data
US 2023/0117705 A1    Apr. 20, 2023

(30) Foreign Application Priority Data

Mar. 13, 2020 (JP) ................. 2020-044781
Mar. 13, 2020 (JP) ................. 2020-044783

(51) Int. Cl.
*G01R 31/28* (2006.01)
*G01R 1/073* (2006.01)

(52) U.S. Cl.
CPC ..... *G01R 1/07378* (2013.01); *G01R 31/2865* (2013.01)

(58) Field of Classification Search
CPC ............ G01R 31/2808; G01R 1/07378; G01R 31/2886; G01R 31/2865; G01R 1/073;
(Continued)

(56) References Cited

U.S. PATENT DOCUMENTS 6,661,248 B2    12/2003   Mori et al.
7,285,968 B2 *  10/2007   Eldridge ............ G01R 31/2863
                                              324/750.22
(Continued)

FOREIGN PATENT DOCUMENTS

JP      S63122140 A     5/1988
JP      200282129 A     3/2002
(Continued)

*Primary Examiner* — Vinh P Nguyen
(74) *Attorney, Agent, or Firm* — VIERING, JENTSCHURA & PARTNER mbB

(57) ABSTRACT

An inspection jig includes a first board, a probe unit including a probe, a second board located in parallel with the first board and electrically connected to the probe, an electrical connection portion electrically connecting the first board and the second board, and a board holding portion holding the second board in parallel with the first board in the thickness direction and holding the probe unit. The board holding portion includes a probe-side holding plate located on the probe unit side of the second board and a holding plate support portion that positions the probe-side holding plate at a position where the probe-side holding plate is in parallel with the first board in the thickness direction. The board holding portion holds the second board so that the first board and the second board are electrically connected via the electrical connection portion being sandwiched between the first board and second board.

20 Claims, 5 Drawing Sheets

(58) Field of Classification Search
CPC ............ G01R 1/07328; G01R 31/2812; G01R 31/2806; G01R 31/2863; G01R 1/067; G01R 31/2889; G01R 31/28; G01R 31/2801; G01R 31/26; G01R 1/04; G01R 31/2831; G01R 31/2844; G01R 31/2896; G01R 31/54; H01R 2201/20; G06F 11/26
See application file for complete search history.

(56) References Cited

U.S. PATENT DOCUMENTS

| | | | |
|---|---|---|---|
| 7,692,433 | B2 | 4/2010 | Eldridge et al. |
| 7,772,863 | B2 * | 8/2010 | Breinlinger ........ G01R 31/2874 324/750.22 |
| 7,808,259 | B2 | 10/2010 | Eldridge et al. |
| 7,960,989 | B2 | 6/2011 | Breinlinger et al. |
| 8,049,525 | B2 | 11/2011 | Yamada et al. |
| 9,588,139 | B2 * | 3/2017 | Fan .................... G01R 1/06733 |
| 9,689,915 | B2 | 6/2017 | Kasai et al. |
| 2010/0237887 | A1 | 9/2010 | Desta et al. |
| 2013/0241588 | A1 | 9/2013 | Yamada |

FOREIGN PATENT DOCUMENTS

| | | | |
|---|---|---|---|
| JP | 2005251813 | A | 9/2005 |
| JP | 2013145210 | A | 7/2013 |
| JP | 201624031 | A | 2/2016 |
| JP | 2019178961 | A | 10/2019 |

* cited by examiner

INSPECTION JIG AND BOARD INSPECTION APPARATUS INCLUDING THE SAME

CROSS-REFERENCE TO RELATED APPLICATIONS

This is a U.S. National Stage Application, filed under 35 U.S.C. § 371, of International Application No. PCT/JP2021/006519, filed on Feb. 22, 2021, and claims priority under 35 U.S.C. § 119(a) and 35 U.S.C. § 365(b) from Japanese Patent Application No. 2020-044781, filed on Mar. 13, 2020 and Japanese Patent Application No. 2020-044783, filed on Mar. 13, 2020; the disclosures of which are incorporated herein by reference.

FIELD

Various embodiments of the present disclosure relate to an inspection jig and a board inspection apparatus including the same.

BACKGROUND

An inspection jig used for inspecting a semiconductor wafer is known. For the inspection jig, conventionally, a known configuration includes a probe unit having a probe that comes into contact with an inspection pad of an inspection target, a space transformer including a ceramic board, a pogo pin unit, and a printed circuit board.

The space transformer has a wiring pattern corresponding to the arrangement pattern of the probe on one surface. The probe and the space transformer are electrically connected by connecting a probe unit to the one surface. The space transformer has a wiring pattern corresponding to the printed circuit board on an opposite surface. The space transformer and the printed circuit board are connected via the pogo pin unit.

In addition, an inspection apparatus that inspects an electrical characteristic of a semiconductor device using a probe card is known. In the inspection apparatus, a tip of a probe needle of the probe card is brought into contact with a terminal on the semiconductor device to inspect the semiconductor device. Therefore, the inspection apparatus has a configuration for performing alignment between the probe card and a mounting table on which the semiconductor device is mounted. Conventionally, there is known a wafer inspection apparatus including a probe card and a transfer arm that transfers a wafer to be inspected, in which a positioning pin of the transfer arm is fitted into a notch of the probe card to align a position where the transfer arm faces the probe card.

Incidentally, in an inspection jig used for inspecting a printed board, a resin board is generally used as a member corresponding to a space transformer. Therefore, in the inspection jig of the printed board, when an electrical connection member such as a pogo pin unit is brought into contact with the board to electrically connect the board and the pogo pin unit to each other, the board may be bent by receiving a pressing force by the electrical connection member. When the board bends, a defect may occur in electrical contact between the electrical connection member and the board. Then, there is a possibility that the inspection of the board to be inspected cannot be stably performed.

In addition, the number of inspection points to be inspected is increasing due to enlargement and miniaturization of semiconductor devices in recent years. As a result, in the inspection apparatus, the number of probes included in the inspection jig is also increasing. As the number of inspection points of the inspection target increases, the force in the thickness direction applied to the board of the inspection jig from the probe increases when the inspection target is inspected using the inspection jig. As a result, the board may be displaced in the thickness direction with respect to the inspection target.

SUMMARY

An exemplary inspection jig according to an embodiment of the present disclosure is an inspection jig attached to an inspection processing portion of a board inspection apparatus that inspects an electric circuit included in a board to be inspected. The inspection jig includes: a first board on which a signal is detected by the inspection processing portion; a probe unit including a probe that comes into contact with the board to be inspected; a second board having one surface facing the first board, located in parallel with the first board in a thickness direction of the first board, and electrically connected to the probe; an electrical connection portion located between the first board and the second board in the thickness direction and electrically connecting the first board and the second board; and a board holding portion that holds the second board in a state of being in parallel within the first board in the thickness direction and holds the probe unit on a side opposite to a first board side. The board holding portion includes: a plate-shaped first holding plate located on the probe unit side of the second board; and a holding plate support portion that positions the first holding plate at a position where the first holding plate is in parallel with the first board in the thickness direction. The board holding portion holds the second board in a state where the first board and the second board are electrically connected via the electrical connection portion by sandwiching the electrical connection portion in the thickness direction between the first board and the second board.

An exemplary board inspection apparatus according to an embodiment of the present disclosure includes the inspection jig.

An exemplary inspection jig according to an embodiment of the present disclosure is an inspection jig attached to an inspection apparatus configured to inspect a board or a semiconductor as an inspection target. The inspection jig includes: a probe that comes into contact with the inspection target and detects an electric signal; a second board that holds the probe and transmits an electric signal detected by the probe; a first board that is located in parallel with the second board in a thickness direction of the second board on a side opposite to the probe side of the second board, and transmits an electric signal transmitted by the second board to the inspection apparatus; an electrical connection portion that electrically connects the first board and the second board; a plate-shaped first board holding portion that holds the first board against the inspection apparatus; and a plate-shaped second board holding portion that holds, on the first board side, the second board toward the first board. The second board holding portion includes a probe connection opening penetrating in the thickness direction at a position overlapping the probe in a plan view of the second board holding portion, an electrical connection accommodating portion penetrating in the thickness direction and accommodating the electrical connection portion, and a first protrusion protruding toward the first board. A distance between the first protrusion and a center of the probe connection opening is shorter than a distance between the electrical connection accommodating portion and a center of the probe connection opening in a plan view of the second board holding portion. At least when the probe is brought into contact with the inspection target, the first protrusion comes into contact with the inspection apparatus or the first board holding portion.

An exemplary inspection apparatus according to an embodiment of the present disclosure includes: the inspection jig; an inspection processing portion that detects a signal of the first board; and a plate-shaped inspection processing holding portion that holds the inspection processing portion. The inspection processing holding portion or the first board holding portion includes a first contacted portion with which the first protrusion is in contact.

The above and other elements, features, steps, characteristics and advantages of the present disclosure will become more apparent from the following detailed description of embodiments with reference to the attached drawings.

DETAILED DESCRIPTION

Figure 1:
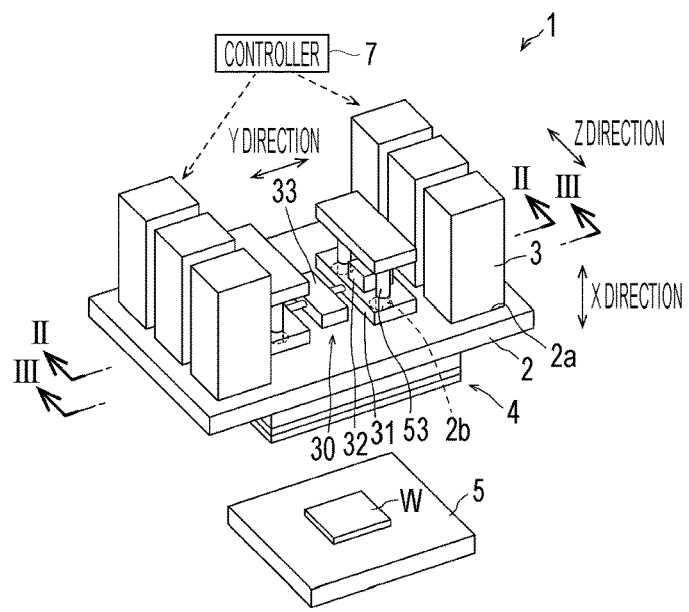
FIG. 1 is a perspective view illustrating a schematic configuration of a board inspection apparatus according to an embodiment.

Embodiments of the present disclosure will be described below in detail with reference to the drawings. The same or corresponding parts in the drawings are denoted by the same reference numerals, and the description thereof will not be repeated. The constituent members in the drawings are not limited to have the dimensions and the dimensional ratios illustrated in the drawings.

In the following description, the expression "fix", "connect", "attach", or the like (hereinafter, fix or the like) is used not only when members are directly fixed or the like to each other, but also when members are fixed or the like to each other with another member interposed therebetween. That is, in the following description, the expression "fix or the like" includes the meaning of direct and indirect fixation or the like of members.

In addition, in the following description, expressions such as "equal" include not only the case of being completely the same but also a range of error.

Figure 2:
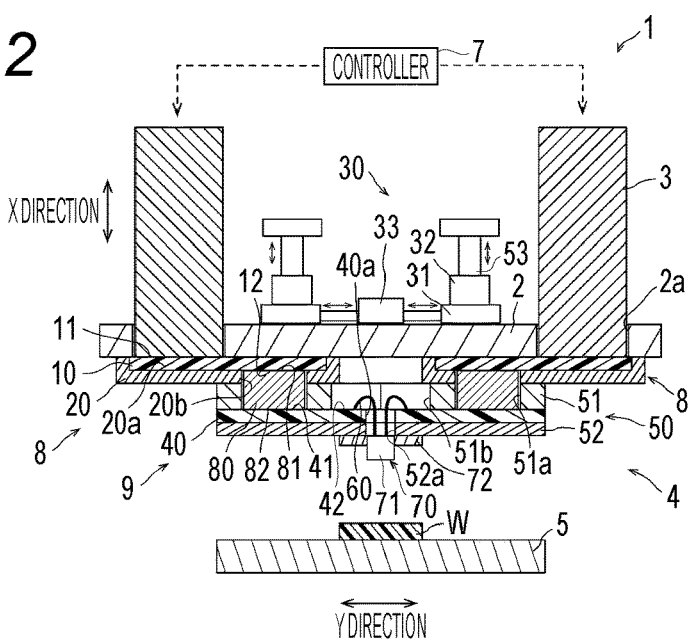
FIG. 2 is a cross-sectional view of the board inspection apparatus.
Figure 3:
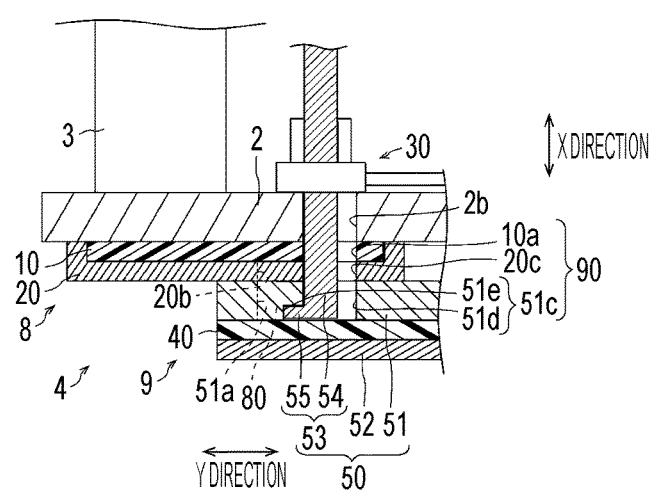
FIG. 3 is a view illustrating a coupling structure of a flat plate and an inspection jig.

FIG. 1 is a perspective view illustrating a schematic configuration of a board inspection apparatus 1 according to an embodiment. FIG. 2 is a cross-sectional view of the board inspection apparatus 1. FIG. 3 is a view illustrating a coupling structure of a flat plate 2 and an inspection jig 4. The board inspection apparatus 1 inspects an electric circuit included in a board W to be inspected. The board W to be inspected is a printed board made of resin.

As illustrated in FIG. 1, the board inspection apparatus 1 includes the flat plate 2, an inspection processing portion 3, the inspection jig 4, an inspection board mounting table 5, a controller 7, and an inspection jig drive unit 30. In the present embodiment, as an example, a case where the number of inspection processing portions 3 is six will be described. However, the number of inspection processing portions may be less than six or more than six.

The flat plate 2 is a member that supports the inspection processing portion 3 and the inspection jig 4. As illustrated in FIGS. 1 and 2, the flat plate 2 has a plate shape. The flat plate 2 has a rectangular opening 2a penetrating in the thickness direction. In the present embodiment, the number of openings 2a is six, which is the same as the number of the inspection processing portions 3. The six openings 2a are arranged in two rows three by three. The flat plate 2 supports the inspection processing portion 3 on one side in the thickness direction by housing a part of the inspection processing portion 3 in the opening 2a. The flat plate 2 supports the inspection jig 4 on the other side in the thickness direction.

The flat plate 2 has four coupling holes 2b penetrating in the thickness direction. As illustrated in FIG. 3, the holding plate support portion 53 of the inspection jig 4 penetrates the coupling hole 2b. The holding plate support portion 53 protrudes to one side of the flat plate 2.

Hereinafter, for the sake of description, the thickness direction of the flat plate 2 is referred to as an "X direction", the column direction of the opening 2a is referred to as a "Y direction", and the direction in which the three openings 2a are arranged is referred to as a "Z direction".

The inspection processing portion 3 inputs a signal to the electric circuit of the board W to be inspected according to a command signal of the controller 7, detects an output signal of the board W to be inspected, and outputs the output signal to the controller 7. A part of each of the six inspection processing portions 3 is supported by the flat plate 2 in a state of being accommodated in each opening 2a. As a result, the inspection processing portions 3 are arranged in three rows in the Z direction and two rows in the Y direction on one side of the flat plate 2.

The inspection processing portion 3 has a terminal portion including a plurality of terminals on the end face on the side accommodated in the opening 2a. The inspection processing portion 3 is electrically connected to a first board 10 of the inspection jig 4 via the terminal portion.

The inspection jig 4 is attached to the flat plate 2 on the side opposite to the inspection processing portion 3 side. The inspection jig 4 is electrically connected to the inspection processing portion 3. In addition, the inspection jig 4 has a probe 71 on the side opposite to the inspection processing portion 3 side. The tip of the probe 71 comes into contact with a terminal of an electric circuit included in the board W to be inspected. The board W to be inspected is electrically inspected in a state where the tip of the probe 71 is in contact with the terminal of the electric circuit. Details of the inspection jig 4 will be described later.

The inspection board mounting table 5 mounts the board W to be inspected. The inspection board mounting table 5 moves in a direction approaching the inspection jig 4 and a direction separating from the inspection jig 4 in a state where the board W to be inspected is fixed on the inspection board mounting table 5. The inspection jig 4 may move with respect to the inspection board mounting table 5.

In the present embodiment, the inspection board mounting table 5 moves in the X direction, the Y direction, and the Z direction. Further, the inspection board mounting table 5 rotates by 360 degrees about the X axis. As a result, the inspection board mounting table 5 can accurately position the board W to be inspected with respect to the inspection jig 4.

The controller 7 controls the operation of the inspection processing portion 3. The controller 7 outputs a command signal to the inspection processing portion 3 to inspect the board W to be inspected. In addition, the controller 7 determines a defect or the like in the electric circuit of the board W to be inspected based on the signal received from the board W to be inspected by the inspection processing portion 3.

The inspection jig drive unit 30 moves a conversion unit 9 of the inspection jig 4 in the X direction. Further, the inspection jig drive unit 30 holds the conversion unit 9 of the inspection jig 4 from the flat plate 2 in a state of being pulled up toward the flat plate 2. As a result, the inspection processing portion 3 and the inspection jig 4 are electrically connected. Details of the inspection jig drive unit 30 will be described later.

Next, the inspection jig 4 will be described in detail with reference to FIGS. 1 to 5. The inspection jig 4 includes a common unit 8 having the first board 10, the conversion unit 9 having a second board 40, and an electrical connection portion 80 that electrically connects the first board 10 and the second board 40. The first board 10 and the second board 40 face each other, and are located in parallel, in the thickness direction, in the order of the first board 10 and the second board 40 from the side close to the flat plate 2.

Figure 4:
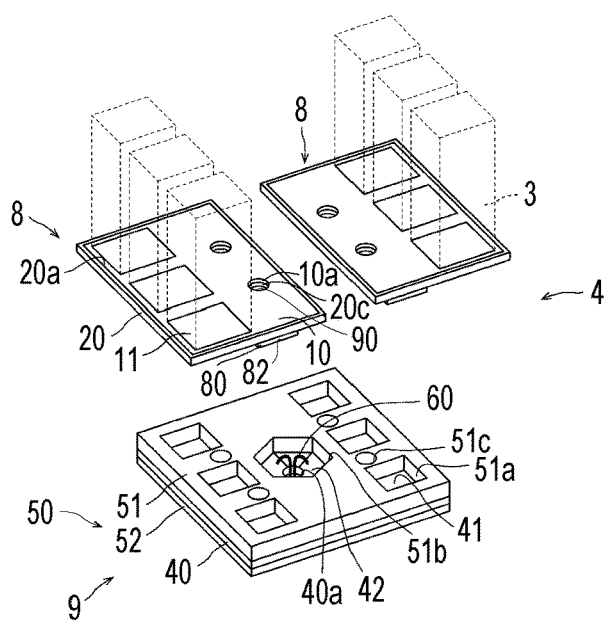
FIG. 4 is an exploded perspective view of an inspection jig.
Figure 5:
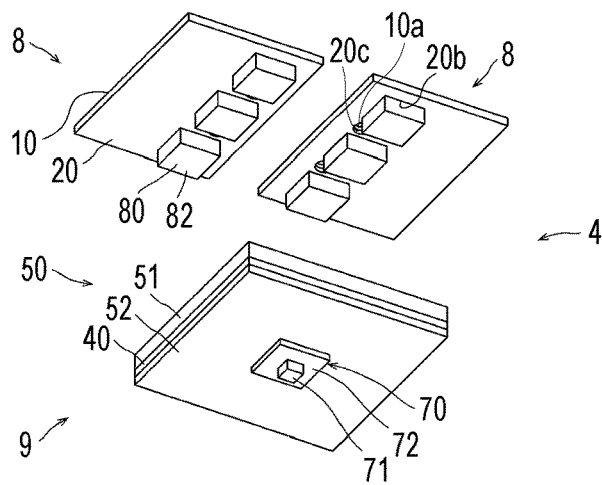
FIG. 5 is an exploded perspective view of the inspection jig.

The inspection jig 4 has a coupling hole 90 extending in the X direction for accommodating the holding plate support portion 53. FIGS. 4 and 5 are perspective views illustrating the conversion unit 9 separated from the inspection jig 4. In FIGS. 4 and 5, the holding plate support portion 53 is not illustrated for the sake of description.

As illustrated in FIGS. 2, 4, and 5, the common unit 8 includes the first board 10 and a first board accommodating portion 20. In the present embodiment, the inspection jig 4 includes two common units 8. Each of two common units 8 is attached at a position covering three aligned openings 2a of the flat plate 2 (see FIG. 2). That is, each common unit 8 faces the end face of the inspection processing portion 3 accommodated in the opening 2a. The constituent members of the two common units 8 are located symmetrically in the Y direction about the center line of the flat plate 2 in the Y direction in a state where the common unit 8 is attached to the flat plate 2. Since the two common units 8 have the same configuration, the configuration of one common unit 8 will be described below.

The first board 10 is a rectangular resin printed board extending in the Y direction and the Z direction. An electric circuit is formed on the first board 10. As illustrated in FIG. 2, the first board 10 has a body-side terminal portion 11 constituting a terminal on one side of the electric circuit on a surface on the flat plate 2 side. In addition, the first board 10 has a second board-side terminal portion 12 constituting a terminal on the other side of the electric circuit on a surface on the second board 40 side. The first board 10 has three body-side terminal portions 11 on the surface on the flat plate 2 side and three second board-side terminal portions 12 on the surface on the second board 40 side.

The body-side terminal portion 11 is in contact with the terminal portion of each inspection processing portion 3. As a result, the signal of the electric circuit transmitted to the first board 10 is transmitted to the inspection processing portion 3. The three second board-side terminal portions 12 are electrically connected to the second board 40 via the electrical connection portion 80 described later.

As illustrated in FIGS. 3 and 4, the first board 10 has two coupling holes 10a penetrating in the thickness direction. The holding plate support portion 53 penetrates the coupling hole 10a. The coupling hole 10a is a part of the coupling hole 90.

The first board accommodating portion 20 has a plate shape extending in the Y direction and the Z direction. The first board accommodating portion 20 is made of a metal material having high rigidity. The metal material is, for example, a metal containing aluminum. As illustrated in FIGS. 2 and 4, the first board accommodating portion 20 has a recess 20a on the flat plate 2 side. The first board 10 is accommodated in the recess 20a.

As illustrated in FIGS. 2 and 5, the first board accommodating portion 20 has three rectangular openings 20b penetrating in the thickness direction on the bottom surface of the recess 20a. The three openings 20b are located at positions corresponding to the three second board-side terminal portions 12 in the first board accommodating portion 20. That is, the second board-side terminal portion 12 is exposed from the first board accommodating portion 20 by the three openings 20b.

As illustrated in FIGS. 3 and 5, the first board accommodating portion 20 has two coupling holes 20c penetrating in the thickness direction. The holding plate support portion 53 penetrates the coupling hole 20c. The coupling hole 20c is a part of the coupling hole 90.

As described above, in the present embodiment, the inspection jig 4 includes the two common units 8. Therefore, the inspection jig 4 includes six body-side terminal portions 11, six second board-side terminal portions 12, six openings 20b, and four coupling holes 20c. That is, the openings 20b are arranged by three in the Z direction and in two rows in the Y direction.

Each of the two first board accommodating portions 20 is attached to the flat plate 2 in a state where the first board 10 is accommodated in the recess 20a.

As illustrated in FIG. 2, the conversion unit 9 includes a second board 40, a board holding portion 50, a connecting conductive wire 60, and a probe unit 70. The conversion unit 9 is not fixed to the common unit 8, but is attached to a position covering the six openings 20b of the common unit 8 by a holding structure described later.

The second board 40 is a rectangular resin printed board extending in the Y direction and the Z direction. The second board 40 has a probe connection hole 40a penetrating in the thickness direction at the center.

As illustrated in FIGS. 2 and 4, an electric circuit is formed on the second board 40. The second board 40 has a first board-side terminal portion 41 constituting a terminal on one side of the electric circuit on a surface on the first board 10 side. In addition, the second board 40 has a probe terminal portion 42 constituting a terminal on the other side of the electric circuit on a surface on the first board 10 side. The second board 40 has six first board-side terminal portions 41 and six probe terminal portions 42 on the surface on the first board 10 side.

The six probe terminal portions 42 are located side by side at equal intervals in the circumferential direction around the probe connection hole 40a as viewed from the X direction.

The six first board-side terminal portions 41 are located at positions facing the six second board-side terminal portions 12 of the first board 10, respectively. That is, the six first board-side terminal portions 41 are located on the outer peripheral side of the second board 40 as viewed from the X direction.

As illustrated in FIG. 3, the board holding portion 50 holds the second board 40 in a state of being in parallel with the first board 10 in the X direction. Specifically, the board holding portion 50 includes a body-side holding plate 51 that holds the second board 40 from the first board 10 side, a probe-side holding plate 52 that holds the second board 40 from the probe 71 side, and a holding plate support portion 53 that holds the second board 40 from the first board 10. The probe-side holding plate 52 is a first holding plate. The body-side holding plate 51 is a second holding plate.

The body-side holding plate 51 has a plate shape extending in the Y direction and the Z direction. The size of the body-side holding plate 51 in the Y direction and the Z direction is the same as the size of the second board 40 in the Y direction and the Z direction. The body-side holding plate 51 is made of a metal material having high rigidity. The metal material is, for example, a metal containing aluminum. The body-side holding plate 51 is located on the first board side of the second board 40.

As illustrated in FIGS. 2 and 4, the body-side holding plate 51 has six rectangular openings 51a penetrating in the thickness direction. The six openings 51a are located at positions corresponding to the first board-side terminal portions 41 in the body-side holding plate 51. That is, the first board-side terminal portion 41 is exposed from the body-side holding plate 51 by the six openings 51a.

As illustrated in FIG. 4, the body-side holding plate 51 has a probe connection hole 51b having a hexagonal shape as viewed from the X direction penetrating in the thickness direction at the center. The probe connection hole 51b is located at a position corresponding to the probe terminal portion 42 of the second board 40 in the body-side holding plate 51. That is, the probe terminal portion 42 is exposed from the body-side holding plate 51 by the probe connection hole 51b.

As illustrated in FIGS. 3 and 4, the body-side holding plate 51 has four accommodation holes 51c penetrating in the thickness direction. The accommodation hole 51c is a part of the coupling hole 90. The accommodation hole 51c is located between the three aligned openings 51a as viewed from the X direction. The accommodation hole 51c includes a shaft accommodation space 51d extending in the thickness direction of the body-side holding plate 51 and a claw accommodation space 51e extending to the side opposite to the probe connection hole 51b side in the Y direction on the second board 40 side of the body-side holding plate 51. A shaft portion 54 of the holding plate support portion 53 is accommodated in the shaft accommodation space 51d. A claw portion 55 of the holding plate support portion 53 is accommodated in the claw accommodation space 51e.

The probe-side holding plate 52 has a plate shape extending in the Y direction and the Z direction. The size of the probe-side holding plate 52 in the Y direction and the Z direction is the same as the size of the body-side holding plate 51 in the Y direction and the Z direction. The thickness of the probe-side holding plate 52 is smaller than the thickness of the body-side holding plate 51. The probe-side holding plate 52 is made of a metal material having high rigidity. The metal material is, for example, a metal containing aluminum. The probe-side holding plate 52 is located on the probe 71 side of the second board 40.

As illustrated in FIG. 2, the probe-side holding plate 52 has a probe connection hole 52a penetrating in the thickness direction at the center. The probe connection hole 52a of the probe-side holding plate 52 and the probe connection hole 40a of the second board 40 are located at the same position as viewed from the X direction.

The body-side holding plate 51 and the probe-side holding plate 52 are connected to each other by a fixing member (not illustrated) in a state where the second board 40 is sandwiched therebetween. In this manner, by sandwiching the second board 40 from both sides in the thickness direction, deformation of the second board 40 in the thickness direction can be suppressed.

As illustrated in FIG. 3, the holding plate support portion 53 is a rod-shaped member. The holding plate support portion 53 includes the shaft portion 54 and the claw portion 55. The shaft portion 54 has a columnar shape extending in the X direction. The claw portion 55 protrudes in the Y direction at the tip of the shaft portion 54. As described above, the holding plate support portion 53 is accommodated in the coupling hole 2b of the flat plate 2, the coupling hole 10a of the first board 10, the coupling hole 20c of the first board accommodating portion 20, and the accommodation hole 51c of the body-side holding plate 51.

As illustrated in FIG. 2, the connecting conductive wire 60 electrically connects the second board 40 and the probe 71 to be described later. One end portion of the connecting conductive wire 60 is connected to the probe terminal portion 42 of the second board 40. The other end of the connecting conductive wire 60 is connected to the probe 71 through the probe connection hole 40a of the second board 40 and the probe connection hole 52a of the probe-side holding plate 52.

The probe unit 70 is attached at a position overlapping the probe connection hole 51b as viewed from the X direction on the side opposite to the second board 40 side of the probe-side holding plate 52. The probe unit 70 includes a probe 71 and a probe support 72.

The probe 71 extends in the X direction. The probe 71 detects a signal of an electric circuit of the board W to be inspected by the tip coming into contact with the terminal of the board W to be inspected.

One end of the connecting conductive wire 60 is electrically connected to an end of the probe 71 on the second board 40 side. The other end of the connecting conductive wire 60 is electrically connected to the second board 40. As a result, the signal of the electric circuit of the board W to be inspected detected by the probe 71 is transmitted to the second board 40 via the connecting conductive wire 60.

The probe support 72 supports the probe 71 with respect to the board holding portion 50. The probe support 72 is fixed to the probe-side holding plate 52 by a fixing member (not illustrated). The fixing member is, for example, a screw, a bolt, or the like. Thus, the probe unit 70 is held by the second board holding portion 50.

As illustrated in FIG. 2, the electrical connection portion 80 is located between the first board 10 and the second board 40. In the present embodiment, the inspection jig 4 has six electrical connection portions 80. The first board 10 side of each electrical connection portion 80 is accommodated in the opening 20b of the first board accommodating portion 20, and is fixed to the first board accommodating portion 20 by a fixing member (not illustrated). The second board 40 side of each electrical connection portion 80 is accommodated in the opening 51a of the body-side holding plate 51.

The electrical connection portion 80 has a first connection portion 81 on the first board 10 side. The first connection portion 81 includes a plurality of contact terminals that are in contact with the second board-side terminal portion 12 of the first board 10. The electrical connection portion 80 has a second connection portion 82 on the second board 40 side. The second connection portion 82 includes a plurality of contact terminals that are in contact with the first board-side terminal portion 41 of the second board 40. At least a part of the first connection portion 81 and the second connection portion 82 can expand and contract in the X direction by the elastic force of the elastic member.

In the present embodiment, the electrical connection portion 80 is constituted by a pogo pin. That is, the first connection portion 81 is pressed against the second board-side terminal portion 12 of the first board 10, and the second connection portion 82 is pressed against the first board-side terminal portion 41 of the second board 40. As a result, the first board 10 and the second board 40 are electrically connected via the electrical connection portion 80.

With the inspection jig 4 having the above configuration, the board W to be inspected can be electrically inspected via the probe 71, the connecting conductive wire 60, the probe terminal portion 42 and the first board-side terminal portion 41 of the second board 40, the electrical connection portion 80, and the second board-side terminal portion 12 and the body-side terminal portion 11 of the first board 10. In the second board 40, the interval between the terminals in the first board-side terminal portion 41 can be made wider than the interval between the terminals in the probe terminal portion 42. In the first board 10, the interval between the terminals in the body-side terminal portions 11 can be made wider than the interval between the terminals in the second board-side terminal portions 12. As a result, even when the interval between the terminals of the board W to be inspected is very narrow, the inspection jig 4 can set the interval between the terminals of the body-side terminal portions 11 to an interval at which the signal can be detected by the inspection processing portion 3.

Next, a holding structure of the second board 40 will be described with reference to FIG. 3. As illustrated in FIG. 3, the inspection jig 4 and the flat plate 2 are coupled by the holding plate support portion 53.

The claw portion 55 of the holding plate support portion 53 is accommodated in the claw accommodation space 51e extending in the Y direction of the accommodation hole 51c. The shaft portion 54 of the holding plate support portion 53 is accommodated in the shaft accommodation space 51d of the accommodation hole 51c of the body-side holding plate 51, the coupling hole 20c of the first board accommodating portion 20, the coupling hole 10a of the first board 10, and the coupling hole 2b of the flat plate 2.

The claw portion 55 of the holding plate support portion 53 is sandwiched between the body-side holding plate 51 and the second board 40 on both sides in the X direction in a state of being accommodated in the claw accommodation space 51e of the accommodation hole 51c. Thus, the second board 40 can be drawn toward the flat plate 2 by moving the holding plate support portion 53 toward the flat plate 2. In a state where the second board 40 is drawn toward the flat plate 2, the inspection jig drive unit 30 holds the holding plate support portion 53 from the flat plate 2. As a result, the holding plate support portion 53 holds the second board 40 in a state of being in parallel with the first board 10 in the X direction. In this manner, the body-side holding plate 51 is fixed to the inspection processing portion 3 by the holding plate support portion 53, so that the probe-side holding plate 52 can be positioned at a position parallel with the first board 10 in the X direction. Thus, the body-side holding plate 51 can be easily supported by the holding plate support portion 53. Therefore, the probe-side holding plate 52 can be easily positioned at a position where the probe-side holding plate 52 is in parallel with the second board 40 in the X direction.

In the present embodiment, the thickness of the body-side holding plate 51 is larger than the thickness of the probe-side holding plate 52. As a result, in the configuration in which the board holding portion 50 is held from the flat plate 2 via the body-side holding plate 51, the rigidity of the board holding portion 50 can be secured. In addition, with this configuration, the board holding portion 50 can be more reliably supported with respect to the flat plate 2.

In the board inspection apparatus 1, the first board 10 and the second board 40 are electrically connected to each other by drawing the second board 40 toward the first board 10 via the holding plate support portion 53. As described above, the electrical connection portion 80 includes a plurality of contact terminals that are in electrical contact with the terminals of the first board 10 and the terminals of the second board 40, respectively, and at least some of the plurality of contact terminals are stretchable in the X direction. In such a configuration, the second board 40 is easily deformed by receiving a reaction force in the X direction by at least some of the contact terminals of the electrical connection portion 80. In such a configuration in which the second board 40 receives the reaction force, the deformation of the second board 40 can be more reliably suppressed by applying the holding structure described above. Therefore, since the second board 40 can be prevented from being separated from the electrical connection portion 80 by being bent in the X direction, stable electrical connection can be performed.

The opening 51a of the board holding portion 50 is located on the outer peripheral side of the body-side holding plate 51 as viewed in the X direction. That is, in a state where the electrical connection portion 80 is accommodated in the opening 51a, the electrical connection portion 80 is located on the outer peripheral side of the second board 40 as viewed in the X direction. When the electrical connection portion 80 is located on the outer peripheral side of the second board 40, the second board 40 is more likely to be deformed. By applying the above-described holding structure to such a configuration, deformation of the second board 40 can be more reliably suppressed.

The holding plate support portion 53 is a rod-shaped member extending through the body-side holding plate 51 and the inspection processing portion 3 in the X direction. The holding plate support portion 53 has, at the tip portion of the holding plate support portion 53, the claw portion 55 extending in a direction intersecting the extending direction of the holding plate support portion 53, and the body-side holding plate 51 has the accommodation hole 51c for accommodating the tip portion of the holding plate support portion 53 as viewed from the X direction. The accommodation hole 51c has the claw accommodation space 51e that extends in a direction different from the probe unit 70 side as viewed from the X direction and accommodates the claw portion 55 of the holding plate support portion 53.

As described above, the claw accommodation space 51e for accommodating the claw portion 55 of the holding plate support portion 53 extends in a direction different from the probe unit 70 side. Therefore, as compared with the configuration in which the claw accommodation space 51e extends toward the probe unit 70, it is possible to suppress the deformation of the body-side holding plate 51 in the thickness direction around the probe unit 7 of the body-side holding plate 51.

Next, the inspection jig drive unit 30 will be described. As illustrated in FIGS. 1 and 2, the inspection jig drive unit 30 includes a drive support portion 31, a first drive unit 32, and a second drive unit 33. The drive support portion 31 has a flat plate shape and is located in parallel with the flat plate 2 in the thickness direction of the flat plate 2. The drive support portion 31 is supported by the flat plate 2 so as to be movable in the Y direction. The holding plate support portion 53 of the conversion unit 9 penetrates the drive support portion 31 in the thickness direction.

The first drive unit 32 moves the holding plate support portion 53 in the X direction with respect to the drive support portion 31 and the flat plate 2. As a result, the body-side holding plate 51 that accommodates the holding plate support portion 53 can be moved in the X direction with respect to the flat plate 2.

In addition, the first drive unit 32 can maintain a state in which the holding plate support portion 53 is moved. As a result, the position in the thickness direction of the body-side holding plate 51 with respect to the flat plate 2 can be fixed. The first drive unit 32 includes, for example, an air cylinder.

The second drive unit 33 moves the drive support portion 31 in the Y direction with respect to the flat plate 2. That is, the holding plate support portion 53 penetrating the drive support portion 31 moves in the Y direction with respect to the flat plate 2 by the second drive unit 33. As a result, the holding plate support portion 53 can be detached from the body-side holding plate 51, which will be described in detail later. The second drive unit 33 includes, for example, an air cylinder.

Next, a method of replacing the conversion unit 9 will be described with reference to FIGS. 6 to 9.

Figure 6:
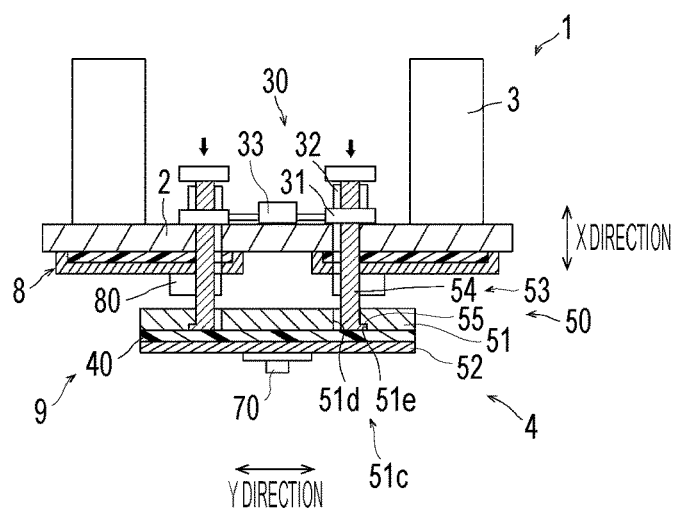
FIG. 6 is a view illustrating a state in which a second board is moved in a direction away from the flat plate.
Figure 7:
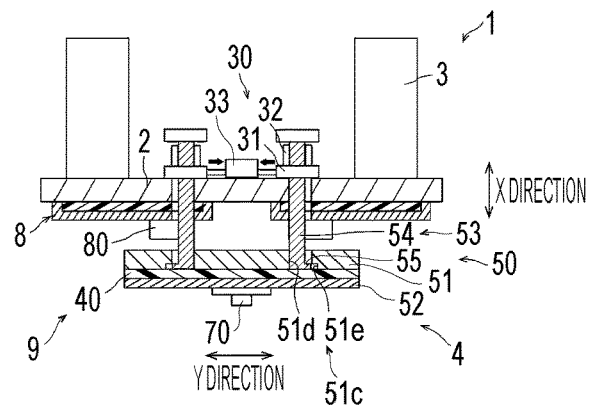
FIG. 7 is a view illustrating a state in which a holding plate support portion is moved in a horizontal direction with respect to the flat plate.
Figure 8:
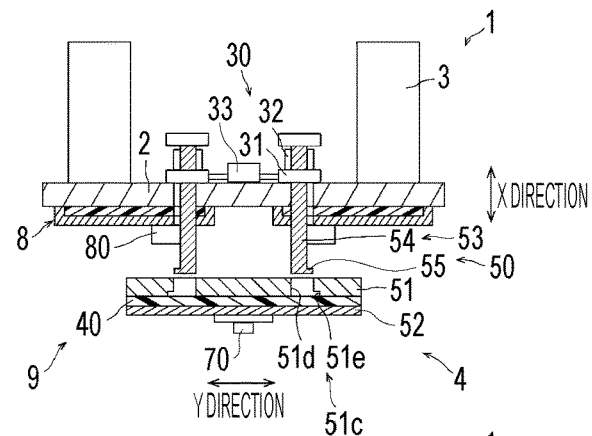
FIG. 8 is a view illustrating a state in which the holding plate support portion is detached from a board holding portion.

When the conversion unit 9 is detached from the board inspection apparatus 1, first, as illustrated in FIG. 6, the first drive unit 32 moves the holding plate support portion 53 toward the inspection jig 4 in the X direction. As a result, the conversion unit 9 can be separated from the flat plate 2. Next, as illustrated in FIG. 7, the second drive unit 33 moves the holding plate support portion 53 toward the probe unit 70 in the Y direction. As a result, the claw portion 55 of the holding plate support portion 53 is pulled out from the claw accommodation space 51e of the accommodation hole 51c. Thereafter, as illustrated in FIG. 8, the holding plate support portion 53 can be detached from the conversion unit 9.

Figure 9:
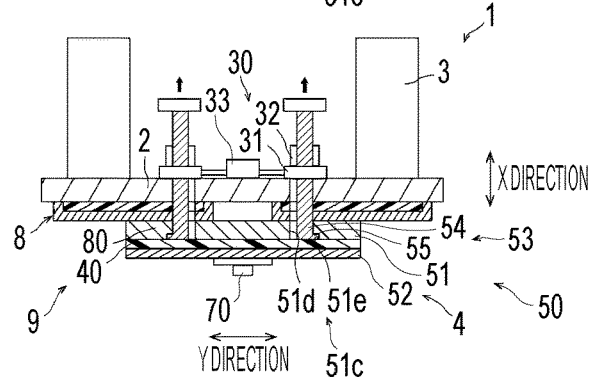
FIG. 9 is a view illustrating a state in which the second board is moved in a direction approaching the flat plate.

When another conversion unit 9 is attached to the board inspection apparatus 1, first, the holding plate support portion 53 is inserted into the accommodation hole 51c of the conversion unit 9. Next, the second drive unit 33 moves the holding plate support portion 53 to the side opposite to the probe unit 70 side in the Y direction. As a result, the claw portion 55 of the holding plate support portion 53 is accommodated in the claw accommodation space 51e of the accommodation hole 51c. Thereafter, the first drive unit 32 moves the holding plate support portion 53 toward the flat plate 2 in the X direction. As a result, as illustrated in FIG. 9, the other conversion unit 9 can be attached to the board inspection apparatus 1.

By replacing the conversion unit 9 in the above-described procedure, the second board 40 can be replaced. As a result, the electric circuit of the first board 10 included in the common unit 8 in which the signal is detected by the inspection processing portion 3 of the board inspection apparatus 1 has a common circuit configuration even when the electric circuits of the board W to be inspected are different, and the second board 40 can be replaced according to the electric circuit of the board W to be inspected. That is, the inspection jig 4 capable of inspecting the board W to be inspected having different electric circuits is obtained. Therefore, since only the second board 40 needs to be replaced according to the electric circuit of the board W to be inspected, it is possible to obtain the inspection jig 4 that can be manufactured in a short period of time and at low cost.

As described above, the inspection jig 4 according to the present embodiment is an inspection jig attached to the inspection processing portion 3 of the board inspection apparatus 1 that inspects an electric circuit of the board W to be inspected. The inspection jig 4 includes the first board 10 on which a signal is detected by the inspection processing portion 3, the probe unit 70 including the probe 71 that comes into contact with the board W to be inspected, the second board 40 having one surface facing the first board 10, located in parallel with the first board 10 in the thickness direction of the first board 10, and electrically connected to the probe, the electrical connection portion 80 located between the first board 10 and the second board 40 in the thickness direction and electrically connecting the first board 10 and the second board 40, and the board holding portion 50 holding the second board 40 in parallel with the first board 10 in the thickness direction and holding the probe unit 70 on a side opposite to a first board side. The board holding portion 50 includes the plate-like probe-side holding plate 52 located on the probe unit 70 side of the second board 40, and the holding plate support portion 53 that positions the probe-side holding plate 52 at a position where the probe-side holding plate 52 is in parallel with the first board 10 in the thickness direction. The board holding portion 50 holds the second board 40 in a state where the first board 10 and the second board 40 are electrically connected via the electrical connection portion 80 by sandwiching the electrical connection portion 80 in the thickness direction between the first board 10 and the second board 40.

In the above configuration, even if the second board 40 receives a force in the thickness direction by the electrical connection portion 80 sandwiched between the first board 10 and the second board 40 in the thickness direction, the deformation of the second board 40 in the thickness direction can be suppressed by the probe-side holding plate 52. In addition, with the above configuration, only the second board 40 of the inspection jig 4 can be replaced according to the electric circuit of the board W to be inspected. That is, the electric circuit of the first board 10 whose signal is detected by the inspection processing portion 3 of the board inspection apparatus 1 has a common circuit configuration even when the electric circuits of the board W to be inspected is different, and the inspection jig 4 that can inspect the boards to be inspected having different electric circuits is obtained by replacing the second board 40 according to the electric circuit of the board W to be inspected. Therefore, the board inspection apparatus 1 including the inspection jig 4 having the above-described configuration can easily inspect the board W to be inspected having different electric circuits.

In the present embodiment, the board holding portion 50 further includes the plate-shaped body-side holding plate 51 located on the first board 10 side with respect to the second board 40. The probe-side holding plate 52 and the body-side holding plate 51 are fixed in a state where the second board 40 is sandwiched in the thickness direction.

As described above, by sandwiching the second board 40 in the thickness direction by the probe-side holding plate 52 and the body-side holding plate 51 of the board holding portion 50, deformation of the second board 40 in the thickness direction can be more reliably suppressed.

The board inspection apparatus 1 according to the present embodiment includes the inspection jig 4. As a result, it is possible to obtain a board inspection apparatus capable of suppressing deflection of a board used in an inspection jig.

While an embodiment of the present disclosure has been described above, the above embodiment is merely an example. Accordingly, the present disclosure is not limited to the embodiment described above, and the embodiment described above may be appropriately modified and implemented without departing from the scope of the present disclosure.

In the above embodiment, the case where the board inspection apparatus 1 includes the six inspection processing portions 3 has been described as an example. Therefore, the flat plate 2 has six openings 2a, the two first board accommodating portions 20 together have six openings 20b, and the body-side holding plate 51 has six openings 51a. However, as long as electrical connection corresponding to the number of inspection processing portions can be configured, the number of openings of each member may be any number.

In the above embodiment, the case where the board inspection apparatus 1 includes the six inspection processing portions 3 has been described as an example. Therefore, the two first boards 10 collectively have six body-side terminal portions 11 and six second board-side terminal portions 12, and the second board 40 has six first board-side terminal portions 41 and six probe terminal portions 42. The board inspection apparatus 1 includes six electrical connection portions 80. However, as long as electrical connection can be made according to the number of inspection processing portions, the number of terminal portions of each member may be any number. In addition, the number of electrical connection portions may be any number.

In the above embodiment, the board inspection apparatus 1 includes two common units 8. However, the number of common units may be other than two.

In the above embodiment, the electrical connection portion 80 is attached to the common unit 8. However, the electrical connection portion may be sandwiched and held between the second board and the first board.

In the above embodiment, the board holding portion 50 that holds the second board 40 includes the body-side holding plate 51 and the probe-side holding plate 52. However, the board holding portion may not include the body-side holding plate.

In the above embodiment, the holding plate support portion 53 is connected to the body-side holding plate 51. However, the holding plate support portion may be connected to any component of the board holding portion as long as the conversion unit can be moved with respect to the flat plate.

In the above embodiment, the holding plate support portion 53 is detachably connected to the body-side holding plate 51. However, the holding plate support portion may be fixed to the body-side holding plate 51 and detachably connected to the flat plate.

In the above embodiment, the openings 2a, 10a, and 51a have rectangular shapes as viewed from the X direction. However, the opening may have any shape as long as the shape does not hinder electrical connection between the terminal portion of the member accommodated in the opening and the terminal portion of the member exposed by the opening.

In the above embodiment, the probe connection hole 51b has a hexagonal shape as viewed from the X direction. However, the probe connection hole may have other shapes.

In the above embodiment, the coupling hole 20c is located between the three aligned openings 51a. However, the position of the coupling hole may be any position as long as the probe-side holding plate can be located at a position where the probe-side holding plate is in parallel with the first board in the X direction.

The inspection apparatus 1 according to the present embodiment inspects an electric circuit included in the inspection target W. In the present embodiment, the inspection target W is a circuit board. The inspection target W may be an electronic component such as a semiconductor wafer, a semiconductor chip, a chip size package (CSP), a wafer level package (WLP), a fan out wafer level package (FOWLP), or a semiconductor element.

Figure 10:
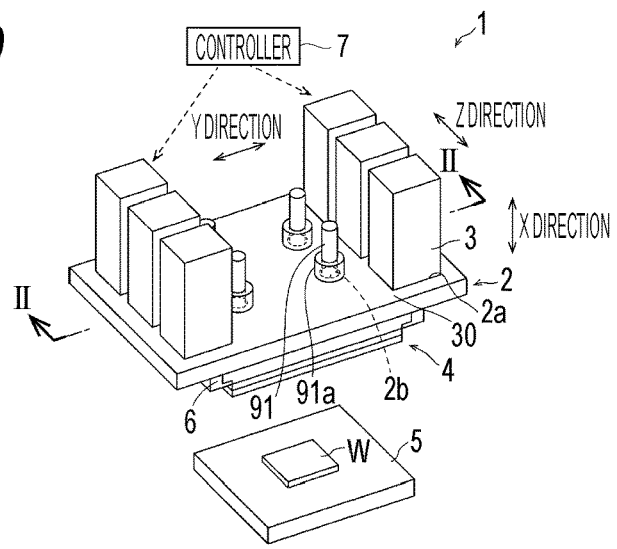
FIG. 10 is a perspective view illustrating a schematic configuration of an inspection apparatus according to an embodiment.

As illustrated in FIG. 10, the inspection apparatus 1 includes an inspection processing holding portion 2, an inspection processing portion 3, an inspection jig 4, an inspection board mounting table 5, a jig holding portion 6, and a controller 7. In the present embodiment, as an example, a case where the number of inspection processing portions 3 is six will be described. However, the number of inspection processing portions may be less than six or more than six.

The inspection processing holding portion 2 is a member that supports the inspection processing portion 3 and the inspection jig 4. The inspection processing holding portion 2 includes a holding body portion 30 and a first contacted portion 31.

Figure 11:
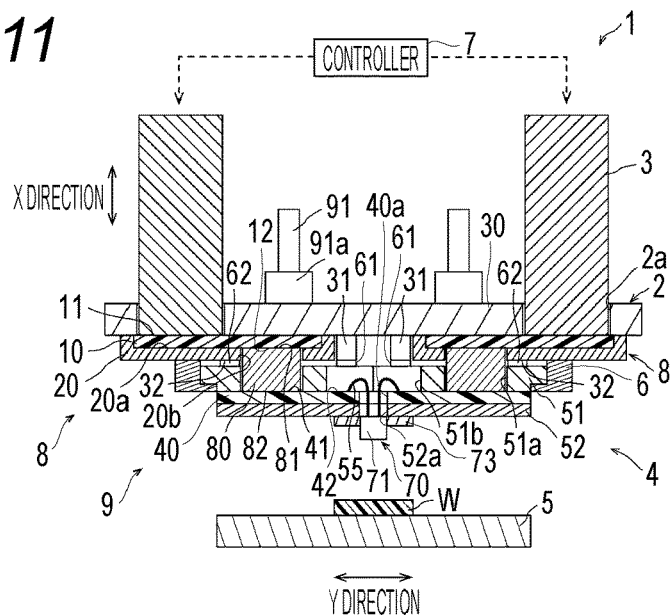
FIG. 11 is a cross-sectional view taken along line II-II of FIG. 10.
Figure 12:
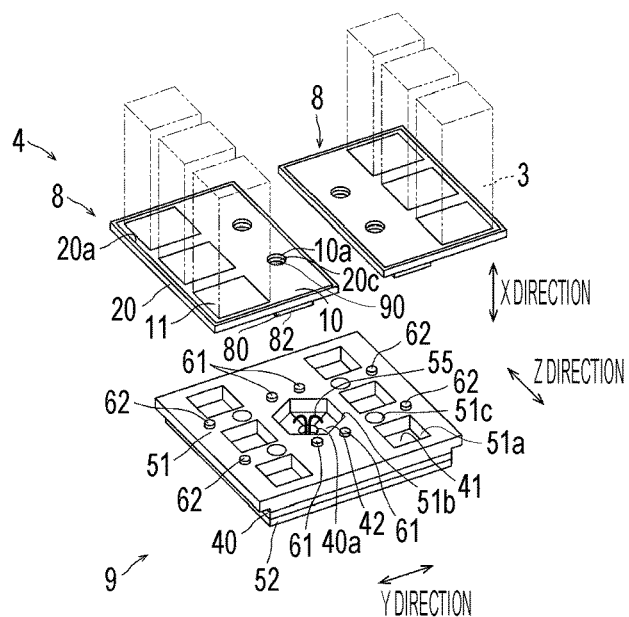
FIG. 12 is an exploded perspective view of the inspection jig as viewed from an inspection processing portion side.

As illustrated in FIGS. 10 to 12, the holding body portion 30 has a plate shape. The holding body portion 30 has a rectangular inspection processing accommodating portion 2a penetrating in the thickness direction. In the present embodiment, the number of the inspection processing accommodating portions 2a is six, which is the same as the number of the inspection processing portions 3. The six inspection processing accommodating portions 2a are arranged in two rows three by three. The holding body portion 30 supports the inspection processing portion 3 on one side in the thickness direction by accommodating a part of the inspection processing portion 3 in the inspection processing accommodating portion 2a.

Hereinafter, for the sake of description, the thickness direction of the holding body portion 30 is referred to as an "X direction", the column direction of the inspection processing accommodating portion 2a is referred to as a "width direction" or a "Y direction", and the direction in which the three inspection processing accommodating portions 2a are arranged is referred to as a "Z direction".

The holding body portion 30 has four coupling holes 2b penetrating the holding body portion 30 in the thickness direction. A coupling member 91 to be described later is accommodated in the coupling hole 2b. The coupling member 91 protrudes to one side of the holding body portion 30 and is fixed to the holding body portion 30 by a jig fixing portion 91a.

The first contacted portion 31 is a columnar member extending in the thickness direction of the holding body portion 30 from a surface of the holding body portion 30 on a side opposite to a side where the coupling member 91 protrudes. The tip of the first contacted portion 31 is in contact with a first protrusion 61. In the present embodiment, the inspection processing holding portion 2 includes four first contacted portions 31. The four first contacted portions 31 have the same height. The first protrusion 61 will be described later.

The inspection processing portion 3 inputs a signal to the electric circuit of the inspection target W according to a command signal of the controller 7, detects the output signal of the inspection target W, and outputs the output signal to the controller 7. The inspection processing portion 3 has a rectangular parallelepiped shape elongated in the X direction. A part of the inspection processing portion 3 is accommodated in the inspection processing accommodating portion 2a of the inspection processing holding portion 2. In the present embodiment, as described above, the number of inspection processing portions 3 is six. A part of each of the six inspection processing portions 3 is supported by the inspection processing holding portion 2 in a state of being accommodated in each inspection processing accommodating portion 2a. As a result, the inspection processing portions 3 are arranged in three rows in the Z direction and two rows in the Y direction on one side of the inspection processing holding portion 2.

The inspection processing portion 3 has a terminal portion including a plurality of terminals on the end face on the side accommodated in the inspection processing accommodating portion 2a. The inspection processing portion 3 is electrically connected to a first board 10 of the inspection jig 4 via the terminal portion.

The inspection jig 4 is attached to a side opposite to the inspection processing portion 3 side of the inspection processing holding portion 2. The inspection jig 4 is electrically connected to the inspection processing portion 3. In addition, the inspection jig 4 has a probe 71 on the side opposite to the inspection processing portion 3 side. The tip of the probe 71 comes into contact with a terminal of an electric circuit of the inspection target W. In a state where the tip of the probe 71 is in contact with the terminal of the electric circuit, a signal is input from the inspection processing portion 3 to the electric circuit of the inspection target W via the inspection jig 4, and the output signal of the electric circuit is transmitted to the inspection processing portion 3 via the inspection jig 4. Details of the inspection jig 4 will be described later.

The inspection target W is placed on the inspection board mounting table 5. The inspection board mounting table 5 moves in a direction approaching the inspection jig 4 and a direction separating from the inspection jig 4 in a state where the inspection target W is fixed on the inspection board mounting table 5. The inspection jig 4 may move with respect to the inspection board mounting table 5.

In the present embodiment, the inspection board mounting table 5 moves in the X direction, the Y direction, and the Z direction. Further, the inspection board mounting table 5 rotates by 360 degrees about the X axis. As a result, the inspection target W placed on the inspection board mounting table 5 is positioned at a position where the inspection target W comes into contact with the tip of the probe 71 of the inspection jig 4.

The jig holding portion 6 fixes the inspection jig 4 to the inspection processing holding portion 2. Specifically, the jig holding portion 6 holds both sides of the body-side holding plate 51 of the inspection jig 4 in the Y direction, and pulls and fixes the inspection jig 4 toward the holding body portion 30.

The coupling member 91 is a rod-shaped member that couples the body-side holding plate 51 of the inspection jig 4 to the inspection processing holding portion 2. The coupling member 91 penetrates the inspection processing holding portion 2, the first board 10, the first board holding portion 20, and the body-side holding plate 51. The tip portion of the coupling member 91 is accommodated in a coupling hole 51c of the body-side holding plate 51. One side of the coupling member 91 is fixed to the body-side holding plate 51. The other side of the coupling member 91 is fixed to the inspection processing holding portion 2. As a result, the second board 40 held by the body-side holding plate 51 is positioned in parallel with the first board 10 in the thickness direction.

The controller 7 controls the operation of the inspection processing portion 3. The controller 7 outputs a command signal of the inspection target W to the inspection processing portion 3. The controller 7 determines a defect or the like in the electric circuit of the inspection target W based on the signal received from the inspection target W by the inspection processing portion 3.

Next, the inspection jig 4 will be described in detail with reference to FIGS. 10 to 15. The inspection jig 4 includes a first board unit 8 and a second board unit 9.

The inspection jig 4 has a coupling hole 90 extending in the X direction for accommodating the coupling member 91.

Figure 13:
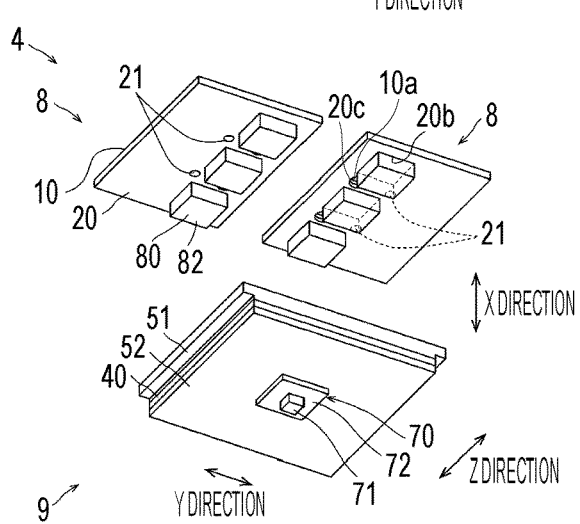
FIG. 13 is an exploded perspective view of the inspection jig as viewed from a probe side.

As illustrated in FIGS. 11 to 13, the first board unit 8 includes the first board 10 and the first board holding portion 20. In the present embodiment, the inspection jig 4 includes two first board units 8. Each of the two first board units 8 is attached to a position that covers three aligned inspection processing accommodating portions 2a of the inspection processing holding portion 2. That is, each of the first board units 8 faces the end face of the inspection processing portion 3 accommodated in the inspection processing accommodating portion 2a. The constituent members of the two first board units 8 are located symmetrically in the Y direction about the center line of the inspection processing holding portion 2 in the Y direction in a state where the first board unit 8 is attached to the inspection processing holding portion 2. Since the two first board units 8 have the same configuration, the configuration of one first board unit 8 will be described below.

The first board 10 is a rectangular resin circuit board extending in the Y direction and the Z direction. As illustrated in FIG. 11, the first board 10 has three body-side terminal portions 11 on the surface on the holding body portion 30 side, and three second board-side terminal portions 12 on the surface on the second board 40 side. Each of the body-side terminal portions 11 and each of the second board-side terminal portions 12 are electrically connected.

The three body-side terminal portions 11 face the three inspection processing portions 3, respectively. Each of the body-side terminal portions 11 comes into contact with the terminal portion of each of the inspection processing portions 3. As a result, the signal of the electric circuit transmitted to the first board 10 is transmitted to the inspection processing portion 3. The three second board-side terminal portions 12 are electrically connected to the second board 40 via the electrical connection portion 80 described later.

As illustrated in FIG. 12, the first board 10 has two coupling holes 10a penetrating in the thickness direction. The coupling hole 10a is a part of the coupling hole 90.

The first board holding portion 20 has a plate shape extending in the Y direction and the Z direction. The first board holding portion 20 is made of a material having sufficient strength to hold the first board 10, for example, a metal containing aluminum. As illustrated in FIGS. 11 and 12, the first board holding portion 20 has a recess 20a on the holding body portion 30 side. The first board 10 is accommodated in the recess 20a.

As illustrated in FIGS. 11 and 13, the first board holding portion 20 has three rectangular first connection accommodating portions 20b penetrating in the thickness direction on the bottom surface of the recess 20a. The three first connection accommodating portions 20b are located at positions corresponding to the three second board-side terminal portions 12 in the first board holding portion 20. That is, the second board-side terminal portion 12 is exposed from the first board holding portion 20 by the three first connection accommodating portions 20b.

As illustrated in FIG. 13, the first board holding portion 20 has two coupling holes 20c penetrating in the thickness direction. The coupling hole 20c is a part of the coupling hole 90.

The first board holding portion 20 has a second contacted portion 21 on the surface on the second board 40 side. The second contacted portion 21 is located at a position corresponding to a second protrusion 62 of the body-side holding plate 51 described later in the first board holding portion 20. The second protrusion 62 will be described later. Note that the first board holding portion 20 may have a first contacted portion located at a position corresponding to the first protrusion 61 of the body-side holding plate 51.

As described above, in the present embodiment, the inspection jig 4 includes the two first board units 8. Therefore, the inspection jig 4 includes six body-side terminal portions 11, six second board-side terminal portions 12, six first connection accommodating portions 20b, and four coupling holes 20c. That is, the first connection accommodating portions 20b are arranged in three rows in the Z direction and two rows in the Y direction.

Each of the two first board holding portions 20 is attached to the inspection processing holding portion 2 in a state where the first board 10 is accommodated in the recess 20a.

As illustrated in FIG. 11, the second board unit 9 includes a second board 40, a body-side holding plate 51, a probe-side holding plate 52, a connecting conductive wire 55, and a probe unit 70. The second board unit 9 is attached at a position covering the six first connection accommodating portions 20b of the first board unit 8. The second board unit 9 is fixed to the inspection processing holding portion 2 by the jig holding portion 6 and the coupling member 91.

The second board 40 is a rectangular resin circuit board extending in the Y direction and the Z direction. The second board 40 has a probe connection hole 40a penetrating in the thickness direction at the center.

As illustrated in FIGS. 11 and 123, the second board 40 has six first board-side terminal portions 41 and six probe connection terminal portions 42 on the surface on the first board 10 side. Each of the first board-side terminal portions 41 and each of the probe connection terminal portions 42 are electrically connected.

The six probe connection terminal portions 42 are located side by side at equal intervals in the circumferential direction around the probe connection hole 40a as viewed from the X direction.

The six first board-side terminal portions 41 are located at positions facing the six second board-side terminal portions 12 of the first board 10, respectively. That is, the six first board-side terminal portions 41 are located on the outer peripheral side of the second board 40 as viewed from the X direction.

As illustrated in FIGS. 11 to 13, the body-side holding plate 51 has a plate shape extending in the Y direction and the Z direction. The length of the body-side holding plate 51 in the Y direction is longer than the length of the second board 40 in the Y direction. The length of the body-side holding plate 51 in the Z direction is the same as the length of the second board 40 in the Z direction. The body-side holding plate 51 is made of a material having sufficient strength for holding the second board 40, for example, a metal containing aluminum. The body-side holding plate 51 is a second board holding portion.

The body-side holding plate 51 holds the second board 40 in a state of being in parallel with the first board 10 in the thickness direction. The body-side holding plate 51 holds the second board 40 from the first board 10 side.

The body-side holding plate 51 is held on both sides in the Y direction by the jig holding portion 6 and fixed to the inspection processing holding portion 2.

Figure 14:
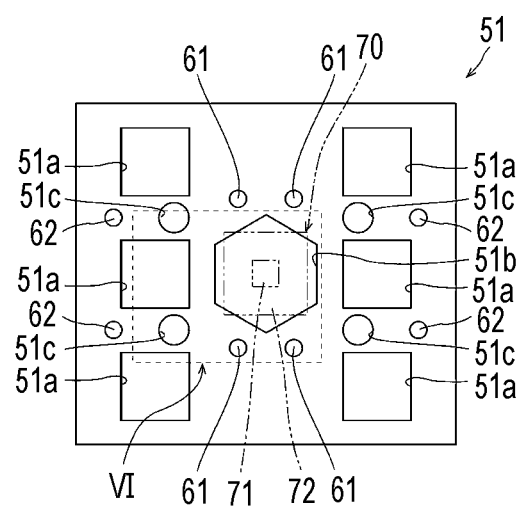
FIG. 14 is a plan view of a second board holding portion.

As illustrated in FIGS. 12 and 14, the body-side holding plate 51 has a hexagonal probe connection opening 51b that penetrates in the thickness direction and is located at the center of the body-side holding plate 51 in a plan view of the body-side holding plate 51. The probe connection opening 51b is located at a position corresponding to the probe connection terminal portion 42 of the second board 40 in the body-side holding plate 51. That is, the probe connection terminal portion 42 is exposed from the body-side holding plate 51 by the probe connection opening 51b. The probe connection opening 51b is an opening.

As illustrated in FIG. 14, the body-side holding plate 51 has six rectangular second connection accommodating portions 51a penetrating in the thickness direction. The six second connection accommodating portions 51a are located at positions corresponding to the first board-side terminal portions 41 in the body-side holding plate 51. That is, in a plan view of the body-side holding plate 51, the six second connection accommodating portions 51a are arranged in a row by three in the Z direction on one side in the Y direction and on the other side in the Y direction of the body-side holding plate 51 with respect to the probe connection opening 51b. The first board-side terminal portion 41 is exposed from the body-side holding plate 51 by the six second connection accommodating portions 51a. The second connection accommodating portion 51a is an electrical connection accommodating portion.

The body-side holding plate 51 has four coupling holes 51c penetrating in the thickness direction. The coupling hole 51c is located between the three second connection accommodating portions 51a arranged side by side as viewed from the X direction. The tip portion of the coupling member 91 is accommodated in the coupling hole 51c. The coupling hole 51c is a part of the coupling hole 90.

The body-side holding plate 51 has cylindrical protrusions 61 and 62 on the surface on the first board 10 side. The body-side holding plate 51 is suppressed from being displaced toward the inspection processing holding portion 2 side by the protrusions 61 and 62. Details of the protrusions 61 and 62 will be described later.

As illustrated in FIGS. 11 to 13, the probe-side holding plate 52 has a plate shape extending in the Y direction and the Z direction. The length of the probe-side holding plate 52 in the Y direction and the Z direction is the same as the length of the body-side holding plate 51 in the Y direction and the Z direction. The thickness of the probe-side holding plate 52 is smaller than the thickness of the body-side holding plate 51. The probe-side holding plate 52 is made of a material having sufficient strength to hold the second board 40, for example, a metal containing aluminum.

The probe-side holding plate 52 is located on the side opposite to the body-side holding plate 51 side with the second board 40 interposed therebetween. That is, the body-side holding plate 51, the second board 40, and the probe-side holding plate 52 are arranged in the thickness direction of the body-side holding plate 51, the second board 40, and the probe-side holding plate 52 in this order from the first board 10 side.

As illustrated in FIG. 11, the probe-side holding plate 52 has the probe connection hole 52a penetrating in the thickness direction at the center. The probe connection hole 52a of the probe-side holding plate 52 and the probe connection hole 40a of the second board 40 are located at the same position as viewed from the X direction.

The body-side holding plate 51 and the probe-side holding plate 52 are connected to each other by a fixing member (not illustrated) in a state where the second board 40 is sandwiched therebetween. In this manner, by sandwiching the second board 40 from both sides in the thickness direction, deformation of the second board 40 in the thickness direction can be suppressed.

As illustrated in FIG. 11, the connecting conductive wire 55 electrically connects the second board 40 and the probe 71 to be described later. One end portion of the connecting conductive wire 55 is connected to the probe connection terminal portion 42 of the second board 40. The other end portion of the connecting conductive wire 55 is connected to the probe 71 through the probe connection hole 40a of the second board 40 and the probe connection hole 52a of the probe-side holding plate 52.

The probe unit 70 is attached to the probe-side holding plate 52 at a position overlapping the probe connection opening 51b in a plan view of the body-side holding plate 51. The probe unit 70 includes a probe 71 and a probe support 72.

The probe 71 is a needle-shaped member extending in the X direction. When the tip of the probe 71 comes into contact with the terminal of the inspection target W, a signal of the electric circuit of the inspection target W is detected.

As illustrated in FIG. 11, one end of the connecting conductive wire 55 is electrically connected to the end of the probe 71 on the second board side. The other end portion of the connecting conductive wire 55 is electrically connected to the second board 40. As a result, the signal of the electric circuit of the inspection target W is transmitted to the second board 40 via the probe 71.

The probe support 72 supports the probe 71 with respect to the body-side holding plate 51. The probe support 72 is fixed to the probe-side holding plate 52 by a fixing member (not illustrated).

As illustrated in FIG. 11, the electrical connection portion 80 is located between the first board 10 and the second board 40. In the present embodiment, the inspection jig 4 has six electrical connection portions 80. The first board 10 side of each electrical connection portion 80 is accommodated in the first connection accommodating portion 20b of the first board holding portion 20, and is fixed to the first board holding portion 20 by a fixing member (not illustrated). The second board 40 side of each electrical connection portion 80 is accommodated in the second connection accommodating portion 51a of the body-side holding plate 51.

The electrical connection portion 80 has a first connection portion 81 in contact with the second board-side terminal portion 12 of the first board 10 on the first board 10 side. The electrical connection portion 80 has a second connection portion 82 in contact with the first board-side terminal portion 41 of the second board 40 on the second board 40 side.

In the present embodiment, the first connection portion 81 and the second connection portion 82 are constituted by pogo pins. That is, the first connection portion 81 is pressed against the second board-side terminal portion 12 of the first board 10, and the second connection portion 82 is pressed against the first board-side terminal portion 41 of the second board 40. As a result, the first board 10 and the second board 40 are electrically connected via the electrical connection portion 80.

At this time, since the second board 40 receives the reaction force of the electrical connection portion 80, the second board is easily deformed to the side opposite to the first board 10 side. However, the second board 40 is held by the probe-side holding plate 52 held from the side opposite to the first board 10 side. As a result, the second board 40 is prevented from being deformed in the thickness direction in a state where the electrical connection portion 80 is in electrical contact with the second board 40.

With the above configuration, the inspection jig 4 transmits the signal of the electric circuit of the inspection target W to the inspection processing portion 3 via the probe 71, the probe connection terminal portion 42 and the first board-side terminal portion 41 of the second board 40, the electrical connection portion 80, and the second board-side terminal portion 12 and the body-side terminal portion 11 of the first board 10. In the second board 40, the interval between the terminals in the first board-side terminal portion 41 can be made wider than the interval between the terminals in the probe connection terminal portion 42. In the first board 10, the interval between the terminals in the body-side terminal portions 11 can be made wider than the interval between the terminals in the second board-side terminal portions 12. Accordingly, even when the interval between the terminals of the inspection target W is very narrow, the inspection jig 4 can set the interval between the terminals of the body-side terminal portions 11 to an interval at which the signal can be detected by the inspection processing portion 3.

Next, the protrusions 61 and 62 of the body-side holding plate 51 will be described in detail with reference to FIGS. 11 to 15.

As illustrated in FIG. 12, the protrusions 61 and 62 have a columnar shape. The protrusions 61 and 62 protrude toward the first board 10 from the surface of the body-side holding plate 51 on the first board 10 side. In the present embodiment, the protrusions 61 and 62 are a part of the body-side holding plate 51. For example, the protrusions 61 and 62 are manufactured by scraping portions other than the protrusions 61 and 62 of the body-side holding plate 51 in the thickness direction. As illustrated in FIG. 14, the protrusions 61 and 62 have a circular cross-sectional shape. Therefore, it is not necessary to form a corner when scraping the body-side holding plate 51. Thus, the protrusions 61 and 62 can be easily manufactured. The protrusions 61 and 62 may be manufactured separately from the body-side holding plate 51 and attached to the body-side holding plate 51. In this case, since the cross-sectional shapes of the protrusions 61 and 62 are circular, it is not necessary to consider an angle viewed from the axial direction with respect to the body-side holding plate 51 when attaching the protrusions 61 and 62. Further, the protrusions 61 and 62 may be manufactured by pressing the body-side holding plate 51.

As illustrated in FIG. 14, in the present embodiment, the protrusions 61 and 62 include four first protrusions 61 located on the central side of the body-side holding plate 51 and four second protrusions 62 located on the outer peripheral side of the body-side holding plate 51 in a plan view of the body-side holding plate 51.

In the present embodiment, the heights of the four first protrusions 61 are the same. The heights of the four second protrusions 62 are the same.

Figure 15:
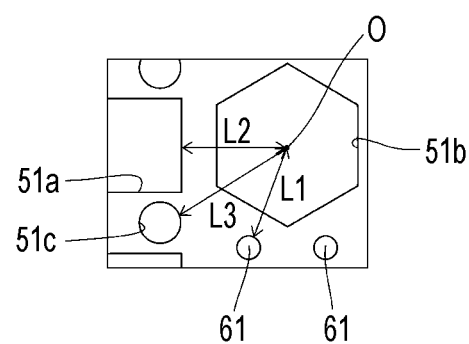
FIG. 15 is a partially enlarged view of FIG. 14.

The four first protrusions 61 are located around the probe connection opening 51b of the body-side holding plate 51. Specifically, as illustrated in FIG. 15, in a plan view of the body-side holding plate 51, a distance L1 between each of the first protrusions 61 and the center O of the probe connection opening 51b is shorter than a distance L2 between the second connection accommodating portion 51a and the center O of the probe connection opening 51b. in a plan view of the body-side holding plate 51, the distance L1 between each of the first protrusions 61 and the center O of the probe connection opening 51b is shorter than a distance L3 between the coupling hole 51c where the coupling member 91 is connected to the body-side holding plate 51 and the center O of the probe connection opening 51b. Each of the first protrusions 61 is located on the center side of the body-side holding plate 51 in the Y direction with respect to the coupling hole 51c that accommodates the coupling member 91. in a plan view of the body-side holding plate 51, two first protrusions 61 are arranged on each side in the Z direction across the probe connection opening 51b. As illustrated in FIG. 11, the four first protrusions 61 protrude toward the inspection processing holding portion 2.

Here, the distance L1 refers to the shortest distance between each first protrusion 61 and the center O of the probe connection opening 51b. The distance L2 refers to the shortest distance between the outer edge of the second connection accommodating portion 51a and the center O of the probe connection opening 51b. The distance L3 refers to the shortest distance between the outer edge of the coupling hole 51c and the center O of the probe connection opening 51b.

As illustrated in FIG. 14, the four second protrusions 62 are located on the outer peripheral side of the body-side holding plate 51 with respect to the probe connection opening 51b in a plan view of the body-side holding plate 51. Specifically, the two second protrusions 62 of the four second protrusions 62 are located on the outer peripheral side of the three second connection accommodating portions 51a arranged in a row on one side in the Y direction of the body-side holding plate 51 and at substantially equal distances from the adjacent second connection accommodating portions 51a of the three second connection accommodating portions 51a arranged in the row. Each of the other two second protrusions 62 of the four second protrusions 62 is located on the outer peripheral side of the three second connection accommodating portions 51a arranged in a row on the other side in the Y direction of the body-side holding plate 51 and at a substantially equal distance from the adjacent second connection accommodating portions 51a of the three second connection accommodating portions 51a arranged in a row. As illustrated in FIG. 11, the four second protrusions 62 protrude toward the first board holding portion 20.

Here, the substantially equal distance from the adjacent second connection accommodating portions 51a refers to a substantially equal distance with the positions of the outer edges closest to each other in the adjacent second connection accommodating portions 51a as reference points. The outer peripheral side of the body-side holding plate 51 with respect to the probe connection opening 51b means an outer peripheral portion of the body-side holding plate 51 with respect to the outer edge of the probe connection opening 51b. The outer peripheral side of the second connection accommodating portion 51a of the body-side holding plate 51 means an outer peripheral portion of the body-side holding plate 51 with respect to the outer edge of the second connection accommodating portion 51a.

As illustrated in FIG. 11, the tips of the four first protrusions 61 come into contact with the first contacted portion 31 of the inspection processing holding portion 2. Thus, the four first protrusions 61 prevent the body-side holding plate 51 from being displaced toward the inspection processing holding portion 2. The tips of the four second protrusions 62 come in contact with the second contacted portion 21 (see FIG. 13) of the first board holding portion 20. As a result, the four second protrusions 62 prevent the body-side holding plate 51 from being displaced toward the inspection processing holding portion 2.

In the present embodiment, the inspection processing holding portion 2 includes the first contacted portion 31 that contacts the first protrusion 61, and the first board holding portion 20 includes the second contacted portion 21 that contacts the second protrusion 62. However, the inspection processing holding portion may include a second contacted portion that contacts the second protrusion, and the first board holding portion may include a first contacted portion that contacts the first protrusion.

Next, effects of the first protrusion 61 and the second protrusion 62 in the inspection apparatus 1 having the above configuration will be described.

In the inspection apparatus 1, a signal of an electric circuit included in the inspection target W is transmitted to the inspection processing portion 3 via the probe 71, the second board 40, and the first board 10. The probe 71, the second board 40, the first board 10, and the inspection processing portion 3 are held by the probe unit 70, the body-side holding plate 51, the first board holding portion 20, and the inspection processing holding portion 2, respectively. In addition, the second board 40 is electrically connected to the first board 10 via the electrical connection portion 80 accommodated in the second connection accommodating portion 51a.

Therefore, in order to stably transmit the signal of the inspection target W detected by the probe 71 to the inspection processing portion 3 at the time of inspection, the position of the first board-side terminal portion 41 of the second board 40 with respect to the second connection portion 82 of the electrical connection portion 80 needs to be kept constant, and the electrical connection state between the second connection portion 82 of the electrical connection portion 80 and the first board-side terminal portion 41 of the second board 40 held by the body-side holding plate 51 needs to be favorably maintained. Therefore, the body-side holding plate 51 needs to suppress displacement in the thickness direction with respect to the first board holding portion 20 and the inspection processing holding portion 2.

The body-side holding plate 51 has the probe connection opening 51b penetrating in the thickness direction at a position overlapping the probe 71 in a plan view of the body-side holding plate 51. Therefore, the rigidity of the body-side holding plate 51 is reduced around the probe connection opening 51*b*. The body-side holding plate 51 includes the second connection accommodating portion 51*a* at a connection position with the electrical connection portion 80. Therefore, the rigidity of the body-side holding plate 51 is reduced around the second connection accommodating portion 51*a*.

Further, the body-side holding plate 51 receives a force displaced toward the probe 71 side by the contact pressure from the electrical connection portion 80 around the second connection accommodating portion 51*a*. The body-side holding plate 51 is fixed to the inspection processing holding portion 2 by the coupling member 91 at the position of the coupling hole 51*c*. The body-side holding plate 51 is drawn toward the inspection processing holding portion 2 on the outer peripheral side of the body-side holding plate 51 with respect to the probe connection opening 51*b*. Therefore, for example, there is a possibility that a part of the body-side holding plate 51 is deformed in the thickness direction, or a part thereof is inclined with respect to the first board holding portion 20.

Further, at the time of inspection of the inspection target W, the body-side holding plate 51 receives a contact pressure from the probe 71 and receives a force of displacement toward the inspection processing holding portion 2 side around the probe connection opening 51*b*. As described above, when the periphery of the probe connection opening 51*b* receives the force of displacement toward the inspection processing holding portion 2, the periphery of the probe connection opening 51*b*, which is the central portion of the body-side holding plate 51, is displaced toward the inspection processing holding portion 2. At this time, the outer peripheral side of the body-side holding plate 51 outside the electrical connection portion 80 is displaced to the side opposite to the inspection processing holding portion 2 side with the electrical connection portion 80 as a fulcrum. As a result, a part of the first board-side terminal portion 41 of the second board 40 is separated from the second connection portion 82 of the electrical connection portion 80, and a contact failure may occur between the electrical connection portion 80 and the second board 40.

In addition, at the time of inspection of the inspection target W, since the periphery of the probe connection opening 51*b* of the body-side holding plate 51 is displaced toward the inspection processing holding portion 2 side, there is a possibility that the probe 71 is not pressed against the inspection target W with a force necessary for the inspection.

However, in the inspection apparatus 1, the body-side holding plate 51 has the first protrusion 61 that comes into contact with the inspection processing holding portion 2 around the probe connection opening 51*b*. As a result, the body-side holding plate 51 prevents the periphery of the probe connection opening 51*b* from being displaced toward the inspection processing holding portion 2. Therefore, the body-side holding plate 51 can keep the position of the first board-side terminal portion 41 of the second board 40 with respect to the second connection portion 82 of the electrical connection portion 80 constant, and suppress a contact failure between the electrical connection portion 80 accommodated in the second connection accommodating portion 51*a* and the second board 40 held by the body-side holding plate 51. In addition, since the displacement of the probe unit 70 located in the probe connection opening 51*b* toward the inspection processing holding portion 2 side is suppressed, the probe 71 can be brought into contact with the inspection target W with a force necessary for the inspection.

In the inspection apparatus 1, the body-side holding plate 51 has the second protrusion 62 that comes into contact with the first board holding portion 20 around the second connection accommodating portion 51*a*. As a result, the body-side holding plate 51 is prevented from being displaced toward the first board holding portion 20 side around the second connection accommodating portion 51*a*.

Therefore, in the inspection apparatus 1, the displacement of the body-side holding plate 51 toward the inspection processing holding portion 2 side with respect to the inspection processing holding portion 2 is suppressed by the first protrusion 61. In addition, the displacement of the probe unit 70 toward the inspection processing holding portion 2 side with respect to the body-side holding plate 51 and the inspection processing holding portion 2 is suppressed by the first protrusion 61. In addition, the displacement of the body-side holding plate 51 toward the inspection processing holding portion 2 side with respect to the first board holding portion 20 at the position of the electrical connection portion 80 is suppressed by the second protrusion 62. As a result, a signal of the inspection target W can be stably transmitted among the probe 71 supported by the probe unit 70, the second board 40 held by the body-side holding plate 51, the first board 10 held by the first board holding portion 20, and the inspection processing portion 3 supported by the inspection processing holding portion 2.

In the above embodiment, the body-side holding plate 51 has four first protrusions 61 and four second protrusions 62. However, the body-side holding plate may have at least one first protrusion 61. In order to suppress the displacement of the body-side holding plate 51 toward the inspection processing holding portion 2 side, the body-side holding plate 51 may have at least one second protrusion 62.

In order to suppress the displacement of the body-side holding plate 51 toward the inspection processing holding portion 2 side, the body-side holding plate 51 can have a plurality of first protrusions 61. In this case, the plurality of first protrusions 61 can be located at positions facing each other with the probe connection opening 51*b* interposed therebetween in a plan view of the body-side holding plate 51. As a result, even when receiving the contact pressure from the probe 71 and receiving the force of displacement toward the inspection processing holding portion 2 side around the probe connection opening 51*b* at the time of inspection of the inspection target W, the body-side holding plate 51 can suppress the displacement toward the inspection processing holding portion 2 side at positions on both sides interposing the probe connection opening 51*b*. Therefore, as compared with a configuration in which the first protrusion 61 is provided only on one side with respect to the probe connection opening 51*b*, the displacement of the body-side holding plate 51 toward the inspection processing holding portion 2 side around the probe connection opening 51*b* can be easily suppressed.

Further, in the configuration in which the body-side holding plate 51 has the plurality of first protrusions 61 at positions facing each other with the probe connection opening 51*b* interposed therebetween, at least two first protrusions 61 of the plurality of first protrusions 61 can be located at one of two positions interposing the probe connection opening 51*b* in a plan view of the body-side holding plate 51. As a result, the body-side holding plate 51 can be brought into contact with the inspection processing holding portion 2 at at least three locations around the probe connection opening 51*b*. Therefore, the displacement of the probe unit 70 toward the inspection processing holding portion 2 side can be suppressed at least at three locations in the thickness direction of the body-side holding plate 51. Therefore, the body-side holding plate 51 is more easily prevented from being displaced toward the inspection processing holding portion 2 side around the probe connection opening 51b.

As described above, the inspection jig 4 is an inspection jig attached to an inspection apparatus configured to inspect a board or a semiconductor. The inspection jig 4 includes the probe 71 that comes into contact with the inspection target and detects an electric signal, the second board 40 that holds the probe 71 and transmits the electric signal detected by the probe 71, the first board 10 that is located in parallel with the second board in a thickness direction of the second board 40 on a side opposite to the probe 71 side of the second board 40 and transmits the electric signal transmitted by the second board 40 to the inspection apparatus, the electrical connection portion 80 that electrically connects the first board 10 and the second board 40, the plate-shaped first board holding portion 20 that holds the first board 10 against the inspection apparatus 1, and the plate-shaped body-side holding plate 51 that holds, on the first board 10 side, the second board 40 from the first board 10. The body-side holding plate 51 includes the probe connection opening 51b that penetrates in the thickness direction at a position overlapping the probe 71 in a plan view of the body-side holding plate 51, the second connection accommodating portion 51a that penetrates the body-side holding plate in the thickness direction and accommodates the electrical connection portion 80, and the first protrusion 61 that protrudes toward the first board 10. The distance between the first protrusion 61 and the center of the probe connection opening 51b is shorter than the distance between the second connection accommodating portion 51a and the center of the probe connection opening 51b in a plan view of the body-side holding plate 51. At least when the probe 71 is brought into contact with the inspection target, the first protrusion 61 comes into contact with the inspection apparatus 1 or the first board holding portion 20.

When the body-side holding plate 51 holding the second board 40 has the probe connection opening 51b penetrating the body-side holding plate 51 in the thickness direction, the rigidity of the body-side holding plate 51 decreases around the probe connection opening 51b. Therefore, there is a possibility that the second board 40 is displaced in the thickness direction with respect to the first board 10. On the other hand, in the above-described configuration, the body-side holding plate 51 has the first protrusion 61 that comes into contact with the inspection processing holding portion 2 or the first board holding portion 20 around the probe connection opening 51b. That is, the first protrusion 61 allows the body-side holding plate 51 to bring the body-side holding plate 51 into contact with the inspection processing holding portion 2 or the first board holding portion 20 around the probe connection opening 51b of the body-side holding plate 51 where the first protrusion 61 is located. As a result, it is possible to suppress the displacement of the second board 40 held by the body-side holding plate 51 toward the inspection processing holding portion 2 or the first board holding portion 20 side around the probe connection opening 51b and around the second connection accommodating portion 51a. Therefore, the body-side holding plate 51 having the plurality of first protrusions 61 can keep the position of the first board-side terminal portion 41 of the second board 40 with respect to the second connection portion 82 of the electrical connection portion 80 constant, and can stabilize the electrical contact between the second board 40 and the electrical connection portion 80. In addition, the probe 71 can be brought into contact with the inspection target W with a necessary force at the time of inspection.

In addition, the second connection accommodating portion 51a includes a plurality of second connection accommodating portions 51a arranged in a row on at least one of one side in the width direction and the other side in the width direction of the body-side holding plate 51 with respect to the probe connection opening 51b in a plan view of the body-side holding plate 51, and the second protrusion 62 is located at substantially equal distances from the adjacent second connection accommodating portions 51a in a plan view of the body-side holding plate 51.

The body-side holding plate 51 can be brought into contact with the inspection processing holding portion 2 or the first board holding portion 20 around the second connection accommodating portion 51a by the second protrusion 62. Therefore, the body-side holding plate 51 is prevented from being displaced toward the inspection processing holding portion 2 side or the first board holding portion 20 side around the second connection accommodating portion 51a. Moreover, the number of the second protrusions 62 may be at least one at a distance substantially equal to the plurality of second connection accommodating portions 51a. Therefore, the displacement of the periphery of the second connection accommodating portion 51a in the body-side holding plate 51 toward the inspection processing holding portion 2 side or the first board holding portion 20 side can be suppressed by the number of second protrusions 62 smaller than the number of second connection accommodating portions 51a.

In the present embodiment, the probe connection opening 51b is located at the center of the body-side holding plate 51 in a plan view of the body-side holding plate 51. In a plan view of the body-side holding plate 51, the plurality of second connection accommodating portions 51a are located side by side, on each of one side in the width direction and the other side in the width direction of the body-side holding plate 51 with respect to the probe connection opening 51b, in a row of three in an orthogonal direction orthogonal to the width direction. The first protrusion 61 includes four first protrusions 61, and is located on the center side in the width direction of the body-side holding plate 51 with respect to the four coupling members 91 in a plan view of the body-side holding plate 51, and two first protrusions 61 of the four first protrusions 61 are located on the side opposite to the other two first protrusions 61 with the probe connection opening 51b interposed therebetween. The second protrusions 62 are located at substantially equal distances from the adjacent second connection accommodating portions 51a on one outer side in the width direction of the body-side holding plate 51 than the centers of the plurality of second connection accommodating portions 51a in a plan view of the body-side holding plate 51, and are located at substantially equal distances from the adjacent second connection accommodating portions 51a on the other outer side in the width direction of the body-side holding plate 51 than the centers of the plurality of second connection accommodating portions 51a.

The inspection jig 4 having six second connection accommodating portions 51a has the first protrusions 61 that are in contact with the inspection processing holding portion 2 or the first board holding portion 20 at four locations around the probe connection opening 51b. In addition, the inspection jig 4 has the second protrusions 62 around the second connection accommodating portions 51a located on one outer side and the other outer side of the body-side holding plate 51 than the first protrusions 61 in the Y direction. As a result, the body-side holding plate 51 can be prevented from being displaced toward the inspection processing holding portion 2 side with respect to the inspection processing holding portion 2 or the first board holding portion 20 by the four first protrusions 61 on the central side of the body-side holding plate 51 and the second protrusions 62 located at least one on each of one side and the other side in the Y direction of the body-side holding plate 51. Therefore, the body-side holding plate 51 can keep the position of the first board-side terminal portion 41 of the second board 40 with respect to the second connection portion 82 of the electrical connection portion 80 constant, and suppress a contact failure between the electrical connection portion 80 accommodated in the second connection accommodating portion 51a and the second board 40 held by the body-side holding plate 51.

In addition, the inspection apparatus 1 includes the inspection jig 4 having the above-described configuration, the inspection processing portion 3 that detects a signal of the first board 10, and the plate-shaped inspection processing holding portion 2 that holds the inspection processing portion 3. The inspection processing holding portion 2 or the first board holding portion 20 includes the first contacted portion 31 with which the first protrusion 61 contacts.

The inspection jig 4 of the inspection apparatus 1 has the first protrusion 61 that comes into contact with the first contacted portion 31 around the probe connection opening 51b. As a result, the body-side holding plate 51 of the inspection jig 4 is prevented from being displaced toward the inspection processing holding portion 2 side around the probe connection opening 51b. Therefore, the displacement of the probe unit 70 held by the body-side holding plate 51 toward the inspection processing holding portion 2 side with respect to the inspection target W can be suppressed. Therefore, the displacement of the outer peripheral side of the body-side holding plate 51 outside the electrical connection portion 80 toward the side opposite to the inspection processing holding portion 2 side is suppressed. That is, in the body-side holding plate 51, a part of the first board-side terminal portion 41 of the second board 40 is less likely to be separated from the second connection portion 82 of the electrical connection portion 80. That is, the body-side holding plate 51 can keep the position of the first board-side terminal portion 41 of the second board 40 with respect to the second connection portion 82 of the electrical connection portion 80 constant, and suppress a contact failure between the electrical connection portion 80 accommodated in the second connection accommodating portion 51a and the second board 40 held by the body-side holding plate 51. In addition, an inspection apparatus capable of bringing the probe 71 into contact with the inspection target W with a necessary force at the time of inspection is obtained.

Further, in the inspection apparatus 1, the protrusion includes the second protrusion 62 which is located on the outer peripheral side of the body-side holding plate 51 with respect to the second connection accommodating portion 51a in a plan view of the body-side holding plate 51 and is in contact with the inspection apparatus 1 or the body-side holding plate 51. The inspection processing holding portion 2 or the first board holding portion 20 includes the second contacted portion 21 with which the second protrusion 62 contacts.

The inspection jig 4 of the inspection apparatus 1 includes the second protrusion 62 that is in contact with the second contacted portion 21 on the outer peripheral side of the body-side holding plate 51. As a result, the body-side holding plate 51 of the inspection jig 4 is prevented from being displaced in the thickness direction with respect to the inspection processing portion 3 on the outer peripheral side of the body-side holding plate 51. Therefore, the displacement of the body-side holding plate 51 toward the inspection processing holding portion 2 side can be suppressed. Therefore, the body-side holding plate 51 can keep the position of the first board-side terminal portion 41 of the second board 40 constant with respect to the second connection portion 82 of the electrical connection portion 80, and can stabilize the electrical contact between the inspection jig 4 and the inspection processing portion 3. In addition, the probe 71 can be brought into contact with the inspection target W with a necessary force at the time of inspection.

The inspection apparatus 1 further includes the coupling member 91 that couples the body-side holding plate 51 to the inspection apparatus 1. The distance between the first protrusion 61 and the center O of the probe connection opening 51b is shorter than the distance between the coupling member 91 and the center of the probe connection opening 51b in a plan view of the body-side holding plate 51.

When the inspection apparatus 1 includes the coupling member 91, the body-side holding plate 51 receives a force pressing toward the inspection processing holding portion 2 side at the position of the coupling hole 51c in which the coupling member 91 is accommodated, and there is a possibility that the body-side holding plate 51 is displaced toward the inspection processing holding portion 2 side. However, since the first protrusion 61 is located closer to the probe connection opening 51b than the position where the coupling member 91 is connected, it is possible to suppress the displacement of the body-side holding plate 51 toward the inspection processing holding portion 2 with respect to the inspection processing holding portion 2 or the first board holding portion 20 around the probe connection opening 51b. Therefore, the electrical contact between the inspection jig 4 and the inspection processing portion 3 can be stabilized. In addition, the probe 71 can be brought into contact with the inspection target W with a necessary force at the time of inspection.

While an embodiment of the present disclosure has been described above, the above embodiment is merely an example. Accordingly, the present disclosure is not limited to the embodiment described above, and the embodiment described above may be appropriately modified and implemented without departing from the scope of the present disclosure.

In the above embodiment, the case where the inspection apparatus 1 includes the six inspection processing portions 3 has been described as an example. Therefore, the inspection processing holding portion 2 has six inspection processing accommodating portions 2a, the two first board holding portions 20 together have six first connection accommodating portion 20b, and the body-side holding plate 51 has six second connection accommodating portion 51a. However, as long as electrical connection corresponding to the number of inspection processing portions can be configured, the number of openings of each member may be any number.

In the above embodiment, the case where the inspection apparatus 1 includes the six inspection processing portions 3 has been described as an example. Therefore, the two first boards 10 together have six body-side terminal portions 11 and six second board-side terminal portions 12, and the second board 40 has six first board-side terminal portions 41 and six probe connection terminal portions 42. The inspection apparatus 1 includes six electrical connection portions 80. However, as long as electrical connection can be made according to the number of inspection processing portions, the number of terminal portions of each member may be any number. In addition, the number of electrical connection portions may be any number.

In the above embodiment, the inspection apparatus 1 includes two first board units 8. However, the number of first board units may be one or more than two.

In the above embodiment, the electrical connection portion 80 is attached to the first board unit 8. However, the electrical connection portion may be sandwiched and held between the second board and the first board.

In the above embodiment, one side of the coupling member 91 is fixed to the inspection processing holding portion 2, and the other side is fixed to the body-side holding plate 51. However, the coupling member may be fixed to any component as long as the inspection processing holding portion and the second board holding plate can be separated from each other.

In the above embodiment, the inspection processing accommodating portions 2a, 10a, and 51a are rectangular as viewed from the X direction. However, the inspection processing accommodating portion only needs to have a shape that does not hinder electrical connection between the terminal portion of the member stored in the inspection processing accommodating portion and the terminal portion of the member exposed by the inspection processing accommodating portion.

In the above embodiment, the probe connection opening 51b has a hexagonal shape as viewed from the X direction. However, the probe connection opening may have other shapes.

In the above embodiment, the coupling hole 20c is located between the three second connection accommodating portions 51a arranged side by side. However, the position of the coupling hole may be any position as long as the probe-side holding plate can be located at a position where the probe-side holding plate is in parallel with the first board in the X direction.

In the above embodiment, the heights of the four first contacted portions 31 are the same. The four first protrusions have the same height. However, the heights of the four first contacted portions may be different from each other. The heights of the four first protrusions may be different from each other. A total length of the height of each of the first contacted portions and the height of the first protrusion in contact with the first contacted portion can be the same for the four combinations.

In the above embodiment, the first contacted portion 31 is a columnar member extending from the surface of the holding body portion 30 on the inspection jig 4 side. However, the first contacted portion may not have a cylindrical shape. The first contacted portion may be located on a surface of the main body holding portion on the inspection jig 4 side.

In the above embodiment, the two first protrusions 61 are located side by side on each side in the Z direction with the probe connection opening 51b interposed therebetween in a plan view of the body-side holding plate 51. However, the two first protrusions may be located side by side on each side in the Y direction with the probe connection opening interposed therebetween in a plan view of the body-side holding plate.

In the above embodiment, the second protrusion 62 is located on the outer peripheral side of the three second connection accommodating portions 51a arranged on one side and the other side in the Y direction of the body-side holding plate 51. However, the second protrusion may be located on the outer peripheral side of the body-side holding plate with respect to the probe connection opening in a plan view of the body-side holding plate. As a result, it is possible to suppress the deformation of the body-side holding plate in the thickness direction with respect to the first board holding portion or the inspection processing holding portion on the outer peripheral side of the body-side holding plate. In addition, the second protrusion may be configured to be located on the outer side, in the Y direction of the body-side holding plate, with respect to the center of the second connection accommodating portion, in a plan view of the body-side holding plate. As a result, it is possible to suppress the deformation in the thickness direction of the body-side holding plate on the outer side in the Y direction of the body-side holding plate with respect to the center of the second connection accommodating portion. Therefore, the body-side holding plate can suppress the deformation in the thickness direction with respect to the first board holding portion or the inspection processing holding portion around the second connection accommodating portion.

In the above embodiment, the second protrusion 62 is located at a substantially equal distance from the adjacent second connection accommodating portions 51a among the three arranged second connection accommodating portions 51a. However, the second protrusion may be located at a different distance from the adjacent second connection accommodating portions among the three arranged second connection accommodating portions. For example, it may be located at any position on the outer side of the body-side holding plate in the Y direction with respect to the second connection accommodating portion 51a.

The present disclosure is applicable to a board inspection apparatus that inspects a plurality of types of boards using a probe.

The present disclosure is also applicable to an inspection apparatus that inspects a circuit board using an inspection jig including a plurality of boards.

Features of the above-described embodiments and the modifications thereof may be combined appropriately as long as no conflict arises.

While certain embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig attached to an inspection processing portion of a board inspection apparatus that inspects an electric circuit included in a board to be inspected, the inspection jig comprising:
   a first board on which a signal is detected by the inspection processing portion;
   a probe unit including a probe that comes into contact with the board to be inspected;
   a second board having one surface facing the first board, located in parallel with the first board in a thickness direction of the first board, and electrically connected to the probe;
   an electrical connection portion located between the first board and the second board in the thickness direction and electrically connecting the first board and the second board; and
   a board holding portion that holds the second board in a state of being in parallel with the first board in the thickness direction and holds the probe unit on a side opposite to a first board side, wherein the board holding portion includes:
- a plate-shaped first holding plate located on a probe unit side of the second board; and
- a holding plate support portion that positions the first holding plate at a position where the first holding plate is in parallel with the first board in the thickness direction, and the board holding portion holds the second board in a state where the first board and the second board are electrically connected via the electrical connection portion by sandwiching the electrical connection portion in the thickness direction between the first board and the second board.

2. The inspection jig according to claim 1, wherein the board holding portion further includes a plate-shaped second holding plate located on the first board side with respect to the second board, and the first holding plate and the second holding plate are fixed in a state where the second board is sandwiched in the thickness direction.

3. The inspection jig according to claim 2, wherein the holding plate support portion fixes the second holding plate to the inspection processing portion to position the first holding plate at a position where the first holding plate is in parallel with the first board in the thickness direction.

4. The inspection jig according to claim 3, wherein the holding plate support portion is a rod-shaped member extending through the second holding plate and the inspection processing portion in the thickness direction, the holding plate support portion includes, at a tip portion of the holding plate support portion, a claw portion extending in a direction intersecting an extending direction of the holding plate support portion, the second holding plate has an accommodation hole that accommodates the tip portion of the holding plate support portion as viewed from the thickness direction, and the accommodation hole has a claw accommodation space that extends in a direction different from the probe unit side as viewed from the thickness direction and accommodates the claw portion of the holding plate support portion.

5. The inspection jig according to claim 3, wherein a thickness of the first holding plate is smaller than a thickness of the second holding plate.

6. The inspection jig according to claim 2, wherein a thickness of the first holding plate is smaller than a thickness of the second holding plate.

7. The inspection jig according to claim 1, wherein the electrical connection portion includes a plurality of contact terminals that are in electrical contact with terminals of the first board and terminals of the second board, and at least some of the plurality of contact terminals are stretchable in the thickness direction.

8. The inspection jig according to claim 1, wherein the electrical connection portion is located on an outer peripheral side of the second board when the second board is viewed in a thickness direction.

9. A board inspection apparatus comprising the inspection jig according to claim 1.

10. An inspection jig attached to an inspection apparatus configured to inspect a board or a semiconductor as an inspection target, the inspection jig comprising:
- a probe that comes into contact with the inspection target and detects an electric signal;
- a second board that holds the probe and transmits an electric signal detected by the probe;
- a first board that is located in parallel with the second board in a thickness direction of the second board on a side opposite to a probe side of the second board, and transmits an electric signal transmitted by the second board to the inspection apparatus;
- an electrical connection portion that electrically connects the first board and the second board;
- a plate-shaped first board holding portion that holds the first board against the inspection apparatus; and
- a plate-shaped second board holding portion that holds, on a first board side, the second board from the first board, wherein the second board holding portion includes a probe connection opening penetrating in the thickness direction at a position overlapping the probe in a plan view of the second board holding portion, an electrical connection accommodating portion penetrating in the thickness direction and accommodating the electrical connection portion, and a first protrusion protruding toward the first board, a distance between the first protrusion and a center of the probe connection opening is shorter than a distance between the electrical connection accommodating portion and the center of the probe connection opening, in a plan view of the second board holding portion, and at least when the probe is brought into contact with the inspection target, the first protrusion comes into contact with the inspection apparatus or the first board holding portion.

11. The inspection jig according to claim 10, wherein the first protrusion includes a plurality of first protrusions, and the plurality of first protrusions are located at positions facing each other with the probe connection opening interposed therebetween in a plan view of the second board holding portion.

12. The inspection jig according to claim 11, wherein at least two first protrusions of the plurality of first protrusions are located at one of two positions interposing the probe connection opening in a plan view of the second board holding portion.

13. The inspection jig according to claim 10, further comprising a second protrusion, wherein the second protrusion is located on an outer peripheral side of the second board holding portion with respect to the probe connection opening in a plan view of the second board holding portion, and comes into contact with the inspection apparatus or the first board holding portion.

14. The inspection jig according to claim 13, wherein the second protrusion is located on an outer side, in a width direction of the second board holding portion, with respect to the center of the electrical connection accommodating portion, in a plan view of the second board holding portion.

15. The inspection jig according to claim 13, wherein the electrical connection accommodating portion includes a plurality of electrical connection accommodating portions arranged in a row on at least one of one side in a width direction and another side in the width direction of the second board holding portion with respect to the probe connection opening in a plan view of the second board holding portion, and the second protrusion is located at substantially equal distances from the adjacent electrical connection accommodating portions in a plan view of the second board holding portion.

16. The inspection jig according to claim 15, wherein
the probe connection opening is located at a center of the second board holding portion in a plan view of the second board holding portion,
the plurality of electrical connection accommodating portions are located on each of one side in the width direction and another side in the width direction of the second board holding portion with respect to the probe connection opening, and are located side by side in a row of three in an orthogonal direction orthogonal to a width direction, in a plan view of the second board holding portion,
the first protrusion includes four first protrusions, and, in a plan view of the second board holding portion, the first protrusion is located closer to a center side of the second board holding portion in the width direction than the plurality of electrical connection accommodating portions, and two first protrusions of the four first protrusions are located on a side opposite to other two first protrusions with the probe connection opening interposed therebetween, and
the second protrusion is located at an equal distance from adjacent electrical connection accommodating portions, on one outer side in the width direction of the second board holding portion with respect to centers of the plurality of electrical connection accommodating portions in a plan view of the second board holding portion, and is located at an equal distance from the adjacent electrical connection accommodating portions, on another outer side in the width direction of the second board holding portion with respect to the centers of the plurality of electrical connection accommodating portions.

17. The inspection jig according to claim 10, wherein the protrusion has a columnar shape.

18. An inspection apparatus comprising:
the inspection jig according to claim 10;
an inspection processing portion that detects a signal of the first board; and
a plate-shaped inspection processing holding portion that holds the inspection processing portion,
wherein the inspection processing holding portion or a first board holding portion includes a first contacted portion with which a first protrusion is in contact.

19. The inspection apparatus according to claim 18, further comprising a second protrusion located on an outer peripheral side of the second board holding portion with respect to the probe connection opening in a plan view of the second board holding portion and coming into contact with the inspection apparatus or the first board holding portion,
wherein the inspection processing holding portion or the first board holding portion includes a second contacted portion with which the second protrusion is in contact.

20. The inspection apparatus according to claim 18, further comprising a coupling member that couples the second board holding portion to the inspection apparatus,
wherein a distance between the first protrusion and a center of the probe connection opening is shorter than a distance between the coupling member and a center of the probe connection opening in a plan view of the second board holding portion.

* * * * *